(12) United States Patent
Zhu et al.

(10) Patent No.: US 10,332,688 B2
(45) Date of Patent: Jun. 25, 2019

(54) METHODS FOR MAKING PEROVSKITE SOLAR CELLS HAVING IMPROVED HOLE-TRANSPORT LAYERS

(71) Applicants: Alliance for Sustainable Energy, LLC, Golden, CO (US); Colorado School of Mines, Golden, CO (US)

(72) Inventors: Kai Zhu, Littleton, CO (US); Zhen Li, Lakewood, CO (US); Alan Sellinger, Golden, CO (US); Jonathan Scott Tinkham, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 15/636,949

(22) Filed: Jun. 29, 2017

(65) Prior Publication Data

US 2018/0005762 A1 Jan. 4, 2018

Related U.S. Application Data

(60) Provisional application No. 62/356,328, filed on Jun. 29, 2016.

(51) Int. Cl.
*H01G 9/20* (2006.01)
*H01L 51/00* (2006.01)
*H01L 51/42* (2006.01)

(52) U.S. Cl.
CPC ......... *H01G 9/2004* (2013.01); *H01G 9/2059* (2013.01); *H01L 51/0004* (2013.01);
(Continued)

(58) Field of Classification Search
None
See application file for complete search history.

(56) References Cited

U.S. PATENT DOCUMENTS

2004/0260047 A1* 12/2004 Chen ..................... C09K 11/06
528/4
2005/0062012 A1* 3/2005 Shinohara ........... H01L 51/0003
252/62.3 R
(Continued)

FOREIGN PATENT DOCUMENTS

EP      1 107 332 A2   6/2001
EP      1 117 137 A2   7/2001
WO   WO 2015/159192 A1  10/2015

OTHER PUBLICATIONS

Nam, "Doping Effect of Organosulfonic Acid in Poly(3-hexylthiophene) Films for Organic Field-Effect Transistors", ACS Appl. Mater. Interfaces 2012, 4, 1281-1288 (Year: 2012).*
(Continued)

*Primary Examiner* — Devina Pillay
(74) *Attorney, Agent, or Firm* — Michael A. McIntyre

(57) ABSTRACT

An aspect of the present disclosure is a device that includes a first layer that includes a hole-transport material and an acid, where the first layer has a conductivity between 20 μS/cm and 500 μS/cm. In some embodiments of the present disclosure, the first layer may absorb light having a wavelength between 400 nm and 600 nm. In some embodiments of the present disclosure, the hole-transport material may include at least one of 2,2',7,7'-tetrakis(N,N-di-p-methoxyphenylamine)-9,9'-spirobifluorene (spiro-OMeTAD), a derivative of spiro-OMeTAD, poly(triarylamine), poly(3-hexylthiophene), and/or N,N'-bis(3-methylphenyl)-N,N'-diphenylbenzidine.

22 Claims, 35 Drawing Sheets

(52) U.S. Cl.
CPC ........ *H01L 51/006* (2013.01); *H01L 51/0032* (2013.01); *H01L 51/0036* (2013.01); *H01L 51/0051* (2013.01); *H01L 51/0059* (2013.01); *H01L 51/0067* (2013.01); *H01L 51/0077* (2013.01); *H01L 51/0091* (2013.01); *H01L 51/4213* (2013.01); *H01L 51/0056* (2013.01); *H01L 51/4226* (2013.01); *Y02E 10/549* (2013.01)

(56) References Cited

U.S. PATENT DOCUMENTS

| 2011/0006288 | A1* | 1/2011 | Katayama | H01L 51/5012 257/40 |
|---|---|---|---|---|
| 2015/0136232 | A1 | 5/2015 | Snaith et al. | |
| 2015/0249170 | A1 | 9/2015 | Snaith et al. | |
| 2015/0279573 | A1 | 10/2015 | Horiuchi et al. | |
| 2015/0311364 | A1* | 10/2015 | Wu | H01L 51/0003 438/82 |
| 2016/0005547 | A1* | 1/2016 | Seok | H01L 51/4226 136/255 |
| 2016/0035496 | A1 | 2/2016 | Irwin et al. | |
| 2016/0049585 | A1 | 2/2016 | Lin et al. | |
| 2018/0166504 | A1* | 6/2018 | Kamino | H01L 51/447 |

OTHER PUBLICATIONS

Kang "Enhanced Performance of Organic Photovoltaic Cells Using F4-TCNQ-PEDOT:PSS Films as a Hole Conducting Layer" Mol. Cryst. Liq. Cryst., vol. 519: pp. 252-259, 2010 (Year: 2010).*
Noh "Nanostructured TiO2/CH3NH3PbI3 heterojunction solar cells employing spiro-OMeTAD/Co-complex as hole-transporting material", J. Mater. Chem. A, 2013, 1, 11842 (Year: 2013).*
Xu "Improvement in Solid-State Dye Sensitized Solar Cells by p-Type Doping with Lewis Acid SnCl4" J. Phys. Chem. C 2013, 117, 22492-22496 (Year: 2013).*
Abate, A. et al., "Influence of ionizing dopants on charge transport in organic semiconductors," Phys. Chem. Chem. Phys., vol. 16, 2014, pp. 1132-1138.
Abate, A. et al., "Protic Ionic Liquids as p-Dopant for Organic Hole Transporting Materials and Their Application in High Efficiency Hybrid Solar Cells," Journal of American Chemical Society, vol. 135, 2013, pp. 13538-13548.
Abate, A. et al., "Lithium salts as "redox active" p-type dopants for organic semiconductors and their impact in solid-state dye-sensitized solar cells," Phys. Chem. Chem. Phys., vol. 15, 2013, pp. 2572-2579.
Abate, A. et al., "Silolothiophene-linked triphenylamines as stable hole transporting materials for high efficiency perovskite solar cells," Energy & Environmental Science, vol. 8, 2015, pp. 2946-2953.
Bach, U. et al., "Solid-state dye-sensitized mesoporous TiO2 solar cells with high photon-to-electron conversion efficiencies," Nature, vol. 395, Oct. 8, 1998, pp. 583-585.
Bergmann, V. et al., "Real-space observation of unbalanced charge distribution inside a perovskite-sensitized solar cell," Nature Communications, vol. 5, Sep. 22, 2014, pp. 1-9.
Burschka, J. et al., "Co(III) Complexes as p-Dopants in Solid-State Dye-Sensitized Solar Cells," Chemistry of Materials, vol. 25, 2013, pp. 2986-2990.
Chen, B. et al., "Origin of J-V Hysteresis in Perovskite Solar Cells," Journal of Physical Chemistry Letters, vol. 7, 2016, pp. 905-917.
Chen, D. et al., "Application of F4TCNQ doped spiro-MeOTAD in high performance solid state dye sensitized solar cells," Phys. Chem. Chem. Phys., vol. 14, 2012, pp. 11689-11694.
de la Blanca, E. et al., "Proton acid doping and conductivity decay of poly N-methylpyrrole," Synthetic Metals, vol. 139, 2003, pp. 145-150.

Han, C. et al., "Protonic Acids: Generally Applicable Dopants for Conducting Polymers," Synthetic Metals, vol. 30, 1989, pp. 123-131.
Heo, J. et al., "Efficient inorganic-organic hybrid heterojunction solar cells containing perovskite compound and polymeric hole conductors," Nature Photonics, vol. 7, Jun. 2013, pp. 486-491.
Heo, J. et al., Planar $Ch_3NH_3PbI_3$ Perovskite Solar Cells with Constant 17.2% Average Power Conversion Efficiency Irrespective of the Scan Rate, Advanced Materials, vol. 27, 2015, pp. 3424-3430.
Hoque, M. et al., "Polarization and Dielectric Study of Methylammonium Lead Iodide Thin Film to Reveal its Nonferroelectric Nature under Solar Cell Operating Conditions," ACS Energy Letters, vol. 1, 2016, pp. 142-149.
Ihly, R. et al., "Efficient charge extraction and slow recombination in organic-inorganic perovskites capped with semiconducting single-walled carbon nanotubes," Energy & Environmental Science, vol. 9, 2016, pp. 1439-1449.
Jeon, N. et al., "Solvent engineering for high-performance inorganic-organic hybrid perovskite solar cells," Nature Materials, vol. 13, Sep. 2014, pp. 897-903.
Kim, G. et al., "A Strategy to Design a Donor-π-Acceptor Polymeric Hole Conductor for an Efficient Perovskite Solar Cell," Advanced Energy Materials, vol. 5, 2015, 8 pages.
Koh, T. et al., "Cobalt Dopant with Deep Redox Potential for Organometal Halide Hybrid Solar Cells," ChemSusChem, vol. 7, 2014, pp. 1909-1914.
Kojima, A., "Organometal Halide Perovskites as Visible-Light Sensitizers for Photovoltaic Cells," Journal of the American Chemical Society, vol. 131, 2009, pp. 6050-6051.
Lee, J. et al., "Formamidinium and Cesium Hybridization for Photo- and Moisture-Stable Perovskite Solar Cell," Advanced Energy Materials, vol. 5, 2015, 9 pages.
Leijtens, T. et al., "Hydrophobic Organic Hole Transporters for Improved Moisture Resistance in Metal Halide Perovskite Solar Cells," Applied Materials & Interfaces, vol. 8, 2016, pp. 5981-5989.
Li, C. et al., "Iodine Migration and its Effect on Hysteresis in Perovskite Solar Cells," Advanced Materials, vol. 28, 2016, pp. 2446-2454.
Li, H. et al., "A Simple 3,4-Ethylenedioxythiophene Based Hole-Transporting Material for Perovskite Solar Cells," Angewandte Chemie, International Edition, vol. 53, 2014, pp. 4085-4088.
Li, Z. "Laminated Carbon Nanotube Networks for Metal Electrode-Free Efficient Perovskite Solar Cells," ACS Nano, vol. 8, No. 7, 2014, pp. 6797-6804.
Li, Z. et al., "Stabilizing Perovskite Structures by Tuning Tolerance Factor: Formation of Formamidinium and Cesium Lead Iodide Solid-State Alloys," Chemistry of Materials, vol. 28, 2016, pp. 284-292.
Li, Z. et al., "Acid Additives Enhancing the Conductivity of Spiro-OMeTAD Toward High-Efficiency and Hysteresis-Less Planar Perovskite Solar Cells," Advanced Science News, vol. 7, 2017, 8 pages.
Liu, Y. et al., "Perovskite Solar Cells Employing Dopant-Free Organic Hole Transport Materials with Tunable Energy Levels," Advanced Materials, vol. 28, 2016, pp. 440-446.
MacDiarmid, A., ""Synthetic Metals": A Novel Role for Organic Polymers" (Nobel Lecture), Angewaldt Chemie, International Edition, vol. 40, 2001, pp. 2581-2590.
Mei, A. et al., "A hole-conductor-free, fully printable mesoscopic perovskite solar cell with high stability," Science, vol. 345, Issue 6194, Jul. 18, 2014, pp. 295-298.
Nam, S. et al., "Doping Effect of Organosulfonic Acid in Poly(3-hexylthiophene) Films for Organic Field-Effect Transistors," Applied Materials & Interfaces, vol. 4, 2012, pp. 1281-1288.
Snaith, H. et al., "Anomalous Hysteresis in Perovskite Solar Cells," Journal of Physical Chemistry Letters, vol. 5, 2014, pp. 1511-1515.
Snaith, H. et al., "Enhanced charge mobility in a molecular hole transporter via addition of redox inactive ionic dopant: Implication to dye-sensitized solar cells," Applied Physics Letters, vol. 89, 2006, pp. 262114-1 through 262114-3.
Trummal, A. et al., "Calculations of $pK_a$ of Superacids in 1,2-Dichloroethane," Journal of Physical Chemistry, vol. 115, 2011, pp. 6641-6645.

(56) References Cited

OTHER PUBLICATIONS

Xu, M. et al., "Improvement in Solid-State Dye Sensitized Solar Cells by p-Type Doping with Leis Acid $SnCl_4$," Journal of Physical Chemistry, vol. 117, 2013, pp. 22492-22496.
Yi, C. et al., "Entropic stabilization of mixed A-cation $ABX_3$ metal halide perovskites for high performance perovskite solar cells," Energy & Environmental Science, vol. 9, 2016, pp. 656-662.
Yu, H. et al., "Native Defect-Induced Hysteresis Behavior in Organolead Iodide Perovskite Solar Cells," Advanced Functional Materials, vol. 26, 2016, pp. 1411-1419.
Zhang, H. et al., "A dual functional additive for the HTM layer in perovskite solar cells," Chem. Communication, vol. 50, 2014, pp. 5020-5022.
Zhao, Y. et al., "Organic-inorganic hybrid lead halide perovskites for optoelectronic and electronic applications," vol. 45, 2016, pp. 655-689.
International Search Report dated Sep. 29, 2017 from corresponding PCT patent application No. PCT/US17/39915, 3 pages.
Written Opinion of the International Searching Authority dated Sep. 29, 2017 from corresponding PCT patent application No. PCT/US17/39915, 5 pages.

\* cited by examiner

METHODS FOR MAKING PEROVSKITE SOLAR CELLS HAVING IMPROVED HOLE-TRANSPORT LAYERS

CROSS-REFERENCE TO RELATED APPLICATIONS

This application claims the benefit of U.S. Provisional Application No. 62/356,328 filed Jun. 29, 2016, the contents of which is incorporated herein by reference in its entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

BACKGROUND

Organic-inorganic hybrid perovskite solar cells (PSCs) have experienced unprecedented efficiency growth from 4% to 22% certified efficiency within several years of active research, allowing significant progress in realizing a low-cost solution-based process for photovoltaics. One of the key components of PSCs is the hole-transport layer (HTL) that is in contact with the perovskite absorber to extract the photogenerated positive charge carriers (holes). HTLs must have a relatively large conductivity, ideally with more affinity for holes than for electrons. While various HTLs ranging from small molecules, polymers, to carbon based materials, have demonstrated good performance in PSCs, 2,2',7,7'-tetrakis(N,N-di-p-methoxyphenylamine)-9,9'-spirobifluorene (spiro-OMeTAD) has prevailed as the dominant hole-transport material for high-efficiency devices. However, pristine spiro-OMeTAD has a relatively low conductivity and moderate hole-mobility, limiting its functionality as a HTL in high-efficiency PSCs.

The conductivity of spiro-OMeTAD may be increased through p-doping, whereby additives are added to increase the charge-carrier density in the material. In organic-semiconductors, this may be achieved using chemical oxidants such as lithium salts, ionic liquids, cobalt(III) salts, F4TCNQ and $SnCl_4$. Lithium bis(trifluoromethanesulfonyl) imide (Li-TFSI) has been used as a dopant for spiro-OMeTAD. While $Li^+$ itself does not have a strong enough redox potential to oxidize spiro-OMeTAD, oxidation by Li-TFSI is a slow process that requires oxygen infiltration (normally from the ambient air) into the hole-transport layer. In addition, the $Li_xO_y$ by-products are hygroscopic compounds, potentially facilitating moisture infiltration into the perovskite layer while the spiro-OMeTAD is aging/oxidizing to improve its conductivity. The moisture ingression is a main cause of the degradation of the perovskite material and device performance. Thus, strategies for rapidly enhancing the conductivity of HTLs represent an important area in developing PSC technology.

SUMMARY

An aspect of the present disclosure is a device that includes a first layer that includes a hole-transport material and an acid, where the first layer has a conductivity between 20 µS/cm and 500 µS/cm. In some embodiments of the present disclosure, the first layer may absorb light having a wavelength between 400 nm and 600 nm. In some embodiments of the present disclosure, the hole-transport material may include at least one of 2,2',7,7'-tetrakis(N,N-di-p-methoxyphenylamine)-9,9'-spirobifluorene (spiro-OMeTAD), a derivative of spiro-OMeTAD, poly(triarylamine), poly(3-hexylthiophene), and/or N,N'-bis(3-methylphenyl)-N,N'-diphenylbenzidine.

In some embodiments of the present disclosure, the acid may include at least one of an organic acid and/or an inorganic acid. In some embodiments of the present disclosure, the first layer may further include a dopant that includes at least one of an alkaline salt, a Co(III) salt, 2,3,5,6-tetrafluoro-7,7,8,8-tetracyanoquinodimethane, $SnCl_4$, Ag—N-butyl-N'-(4-pyridylheptyl)imidazolium bis(trifluoromethane)sulfonamide (Ag-TFSI), N-butyl-N'-(4-pyridylheptyl)imidazolium bis(trifluoromethane)sulfonimide, and/or $N(PhBr)_3SbCl_6$. In some embodiments of the present disclosure, the conductivity may be between 100 µS/cm and 500 µS/cm.

In some embodiments of the present disclosure, the device may further include a perovskite layer and an electron-transport layer, where the perovskite layer may be positioned between the layer and the electron-transport layer, and the device has a fill-factor of greater than 0.70 and a power conversion efficiency of greater than 17%. In some embodiments of the present disclosure, the perovskite layer may include $ABX_3$, A is a first cation, B is a second cation, and X is an anion. In some embodiments of the present disclosure, the first cation may include an alkyl ammonium cation and/or an alkali metal cation. In some embodiments of the present disclosure, the alkali metal cation may include at least one of cesium and/or rubidium. In some embodiments of the present disclosure, the alkyl ammonium cation may include at least one of methylammonium, ethylammonium, propylammonium, butylammonium, and/or formamidinium (FA).

In some embodiments of the present disclosure, the second cation may include at least one of lead, tin, and/or germanium. In some embodiments of the present disclosure, the anion may include a halogen. In some embodiments of the present disclosure, the perovskite layer may include $FA_{1-x}Cs_xPbI_3$, where x is between zero and 1.0 inclusively. In some embodiments of the present disclosure, the perovskite layer may include $FA_{0.85}Cs_{0.15}PbI_3$.

An aspect of the present disclosure is a method that includes mixing a hole-transport material, a dopant, an acid, and a solvent to form a solution; separating the solution into a liquid and a solid; applying the liquid to a surface of a perovskite layer to form a liquid layer on the surface; and removing at least a portion of the solvent to transform the liquid layer to a solid layer comprising the hole-transport material, the dopant, and the acid, where the liquid is substantially free of the solid, the solid is substantially free of the liquid, and the solid layer has a conductivity between 100 µS/cm and 500 µS/cm.

In some embodiments of the present disclosure, the separating may be performed by at least one of filtrating, centrifugation, and/or electrostatic separation. In some embodiments of the present disclosure, the separating may be by filtration using a filter having an average pore size of less than 1.0 microns. In some embodiments of the present disclosure, the applying may be performed using at least one of spin-coating, curtain-coating, dip-coating, blade-coating, slot-die coating, and/or spraying. In some embodiments of the present disclosure, the mixing may be performed at a temperature between 15° C. and 100° C. In some embodiments of the present disclosure, the removing may be performed by at least one of centrifugation, heating the liquid layer, and/or flowing a gas over the liquid layer. In some embodiments of the present disclosure, the removing may include heating the liquid layer to a temperature between 30° C. and 100° C.

BRIEF DESCRIPTION OF THE DRAWINGS

Exemplary embodiments are illustrated in referenced figures of the drawings. It is intended that the embodiments and figures disclosed herein are to be considered illustrative rather than limiting.

(FIG. 21, starting from the left: undoped, $H_3PO_4$, Li-TFSI+$H_3PO_4$, Li-TFSI, Co(III), and Co(III)+$H_3PO_4$; FIG. 22 starting from the top: Co(III)+$H_3PO_4$, Co(III), Li-TFSI+$H_3PO_4$, Li-TFSI, $H_3PO_4$, and undoped.)

(FIG. 27: solid line—$V_{oc}$ to $J_{sc}$; dashed line—$J_{sc}$ to $V_{oc}$.)

REFERENCE NUMBERS

Figure 1:
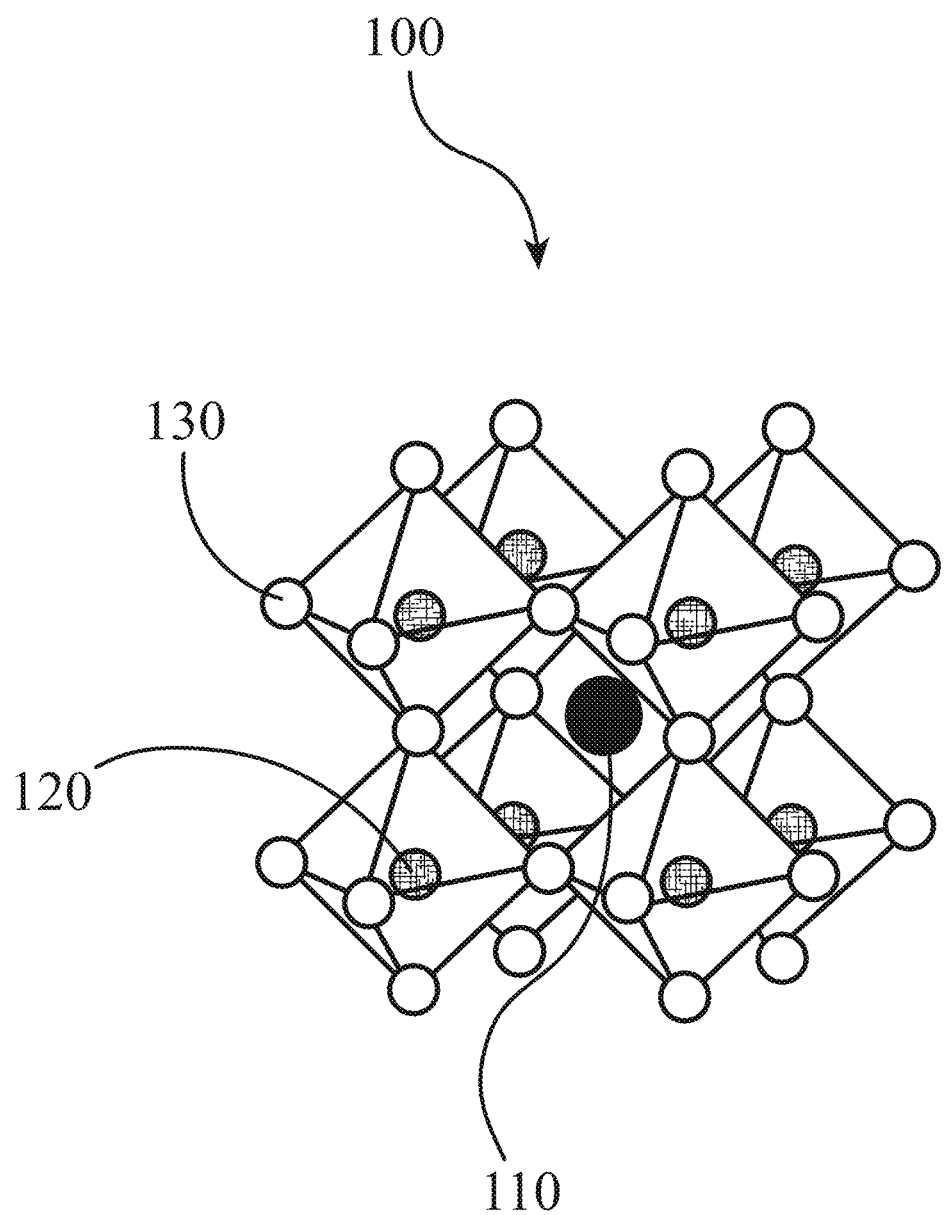
FIG. 1 illustrates a perovskite, according to some embodiments of the present disclosure.

100 . . . perovskite
110 . . . A-cation
120 . . . B-cation
130 . . . anion (X)
200 . . . device
210 . . . hole-transport layer (HTL)
220 . . . perovskite layer
230 . . . electron-transport layer (ETL)
240 . . . first charge collecting layer
250 . . . second charge collecting layer
300 . . . method
310 . . . mixing
312 . . . hole-transport material
314 . . . acid
316 . . . dopant
317 . . . solvent
318 . . . solution
320 . . . separating
322 . . . solid
324 . . . liquid
330 . . . applying
332 . . . intermediate device
334 . . . device having a liquid layer
340 . . . removing
344 . . . volatiles
350 . . . device having a solid hole-transport layer

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

FIG. 1 illustrates that a perovskite may organize into cubic crystalline structures and may be described by the general formula ABX$_3$, where X (130) is an anion and A (110) and B (120) are cations, typically of different sizes with the A-cation 110 typically larger than the B-cation 120. In a cubic unit cell, the B-cation 120 resides at the eight corners of a cube, while the A-cation 110 is located at the center of the cube and is surrounded by 12 X-anions centrally located along each edge of the unit cell. Typical inorganic perovskites include calcium titanium oxide (calcium titanate) minerals such as, for example, CaTiO$_3$ and SrTiO$_3$. In some embodiments of the present invention, the A-cation 110 may include a nitrogen-containing organic compound such as an alkyl ammonium compound. The B-cation 120 may include a metal and the anion 130 may include a halogen.

Additional examples for an A-cation 110 include organic cations and/or inorganic cations. Inorganic examples of an A-cation 110 include the cation forms of at least one of cesium, rubidium, potassium, sodium, and/or silver. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium (CH$_3$NH$_3^+$), ethylammonium (CH$_3$CH$_2$NH$_3^+$), propylammonium (CH$_3$CH$_2$CH$_2$NH$_3^+$), butylammonium (CH$_3$CH$_2$CH$_2$CH$_2$NH$_3^+$), formamidinium (FA) (CH(NH$_2$)$_2$)$^+$, and/or any other suitable nitrogen-containing organic compound. Thus, an A-cation 110 may include an alkylamine, an organic component with one or more amine groups.

Examples of metal B-cations 120 include, for example, lead, tin, germanium, and or any other 2+ valence state metal that can charge-balance the perovskite 100. Examples for the anion 130 include halogens and pseudo-halogens. Halogens are fluorine, chlorine, bromine, iodine and/or astatine. Examples of pseudo-halogens include SCN, SeCN, PCO, OCl, OBr, and/or OI. In some cases, a perovskite 100 may include more than one anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and the anion 130 (X) may be selected within the general formula of ABX$_3$ to produce a wide variety of perovskites 100, including, for example, methylammonium lead triiodide (CH$_3$NH$_3$PbI$_3$ also referred to herein as MAPbI$_3$), and mixed halide perovskites such as MAPbI$_{3-x}$Cl$_x$ and MAPbI$_{3-x}$Br$_x$. Thus, a perovskite 100 may have more than one halogen element, where the various halogen elements are present in none-integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure.

As stated above, the A-cation 110 may include an organic constituent in combination with a nitrogen constituent. In some cases, the organic constituent may be an alkyl group such as straight-chain and/or branched saturated hydrocarbon group having from 1 to 20 carbon atoms. In some embodiments, an alkyl group may have from 1 to 6 carbon atoms. Examples of alkyl groups include methyl (C$_1$), ethyl (C$_2$), n-propyl (C$_3$), isopropyl (C$_3$), n-butyl (C$_4$), tert-butyl (C$_4$), sec-butyl (C$_4$), iso-butyl (C$_4$), n-pentyl (C$_5$), 3-pentanyl (C$_5$), amyl (C$_5$), neopentyl (C$_5$), 3-methyl-2-butanyl (C$_5$), tertiary amyl (C$_5$), and n-hexyl (C$_6$). Additional examples of alkyl groups include n-heptyl (C$_7$), n-octyl (C$_8$) and the like.

Figure 2:
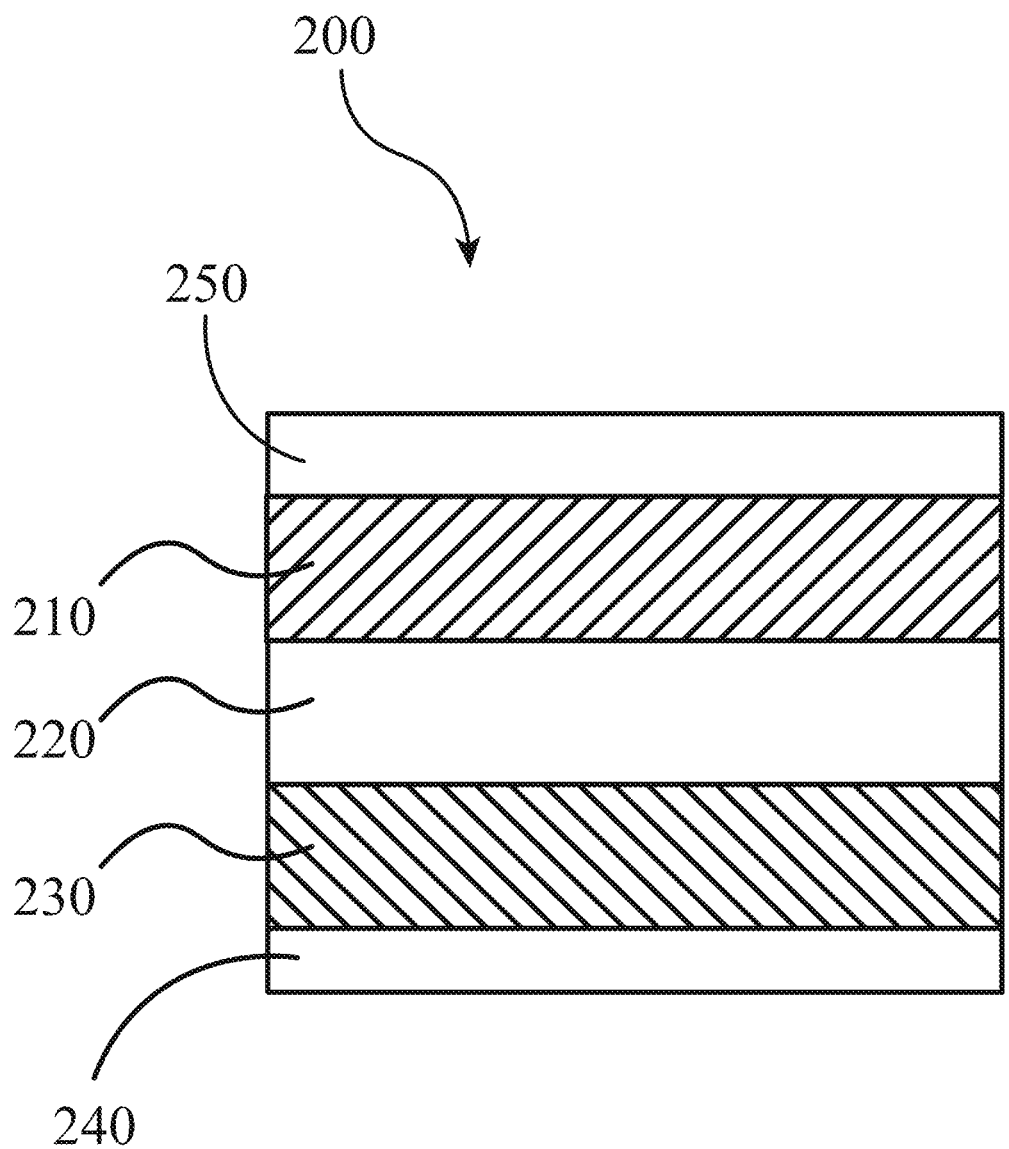
FIG. 2 illustrates a device containing, among other things, a perovskite layer in contact with a hole transport layer, according to some embodiments of the present disclosure.

FIG. 2 illustrates an example of a device 200 (e.g. a PSC) that includes a perovskite layer 220 positioned between a hole-transport layer (HTL) 210 and an electron-transport layer (ETL) 230. The device 200 also includes a first charge collecting layer 240 and a second charge collecting layer 250. The perovskite layer 220 may include any perovskite 100 material described above and illustrated in FIG. 1. In some embodiments of the present disclosure, the perovskite layer 220 may perform as an "active layer" that absorbs light resulting in the photovoltaic effect (e.g. the generation of a voltage/current). For example, the perovskite layer 220 may include at least one of MAPbI$_3$, MAPbBr$_3$, MAPbCl$_3$, $MAPbI_{3-x}Cl_x$, $MAPbI_{3-x}Br_x$, $MA_{1-y}FA_yPbI_{3-x}Br_x$, $MA_{1-y}Cs_yPbI_{3-x}Br_x$, $FA_{1-y}Cs_yPbI_{3-x}Br_x$, $FA_{1-z-y}MA_yCs_zPbI_{3-x}Br_x$, where x is between zero and 3.0, y is between zero and 1.0, and z is between zero and 1.0 inclusively. In some examples, the lead in a perovskite may be replaced partially or completely by Sn and/or Ge. In some embodiments of the present disclosure, the perovskite layer may include at least one of $FA_{1-x}Cs_xPbI_3$, where x is between zero and 1.0 inclusively. In some embodiments of the present disclosure, a perovskite layer may have a thickness between 10 nm and 100 μm, or between 50 nm and 10 μm.

As used herein, a HTL and a hole-transport material preferentially transport charges that are holes versus charges that are electrons. Conversely, an ELT and an electron-transport material preferentially transport charges that are electrons versus charges that are holes. Referring again to FIG. 2, the HTL 210 may include at least one of 2,2',7,7'-tetrakis(N,N-di-p-methoxyphenylamine)-9,9'-spirobifluorene (spiro-OMeTAD), a derivative of spiro-OMeTAD, poly (triarylamine), poly(3-hexylthiophene), and/or N,N'-bis(3-methylphenyl)-N,N'-diphenylbenzidine. Examples of derivatives of spiro-OMeTAD include N2,N2,N2',N2',N7,N7',N7'-octakis(4-methoxyphenyl)-9,9'-spirobi[fluorene]-2,2',7,7'-tetraamine (abbreviated as pp-spiro-OMeTAD), N2,N2',N7,N7'-tetrakis(3-methoxyphenyl)-N2,N2',N7,N7'-tetrakis(4-methoxyphenyl)-9,9'-spirobi[fluorene]-2,2',7,7'-tetraamine (abbreviated as pm-spiro-OMeTAD), and/or N2,N2',N7,N7'-tetrakis(2-methoxyphenyl)-N2,N2',N7,N7'-tetrakis(4-methoxyphenyl)-9,9'-spirobi[fluorene]-2,2',7,7'-tetraamine (abbreviated as po-spiro-OMeTAD). In some embodiments of the present disclosure, a HTL 210 may have a thickness between 50 nm and 500 nm. Methods described herein lead to devices (e.g. PSCs) with improved properties and characteristics, including hole-transport layers having improved conductivities and light absorbance characteristics. In addition, these methods result in photovoltaic devices having other improved performance characteristics, including increased power conversion efficiencies, improved open circuit voltages, improved fill factors, improved stabilized power outputs, and reduced hysteresis.

In some embodiments of the present disclosure, an electron-transport layer (ETL) 230 may include $TiO_2$, $SnO_2$, ZnO, $BaSnO_3$, [6,6]-phenyl-$C_{61}$-butyric acid methyl ester (PCBM), and/or buckminsterfullerene (C60). A thickness of an ETL may be between 50 nm and 500 nm. The first charge collecting layer 240 may be constructed of fluorine-doped tin oxide, indium tin oxide, indium zinc oxide, and/or $Cd_2SnO_4$. The second charge collecting layer 250 may be constructed of at least one of silver, gold, copper, and/or aluminum. The typical thickness of a charge collecting layer ranges from 20 nm to several micrometers. It should be noted that the relative position of the first charge collecting layer 240 and the second charge collecting layer 250 may be switched, depending on the method of constructing the final device 200 and/or the specific final application.

Figure 3:
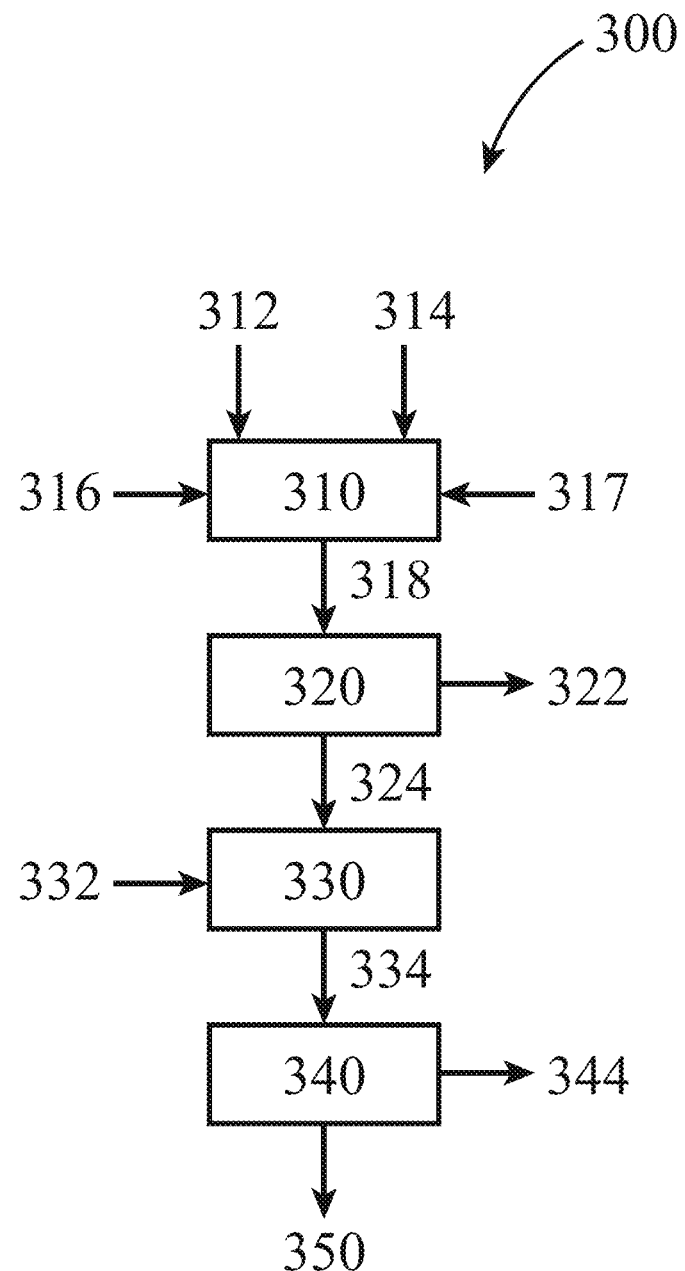
FIG. 3 illustrates a method for making a hole transport layer having improved properties, according to some embodiments of the present disclosure.

FIG. 3 illustrates a method 300 for producing HTLs, according to some embodiments of the present disclosure. In the example shown, the method 300 begins with the mixing 310 of a hole-transport material 312 (e.g. at least one of the materials listed above for a HTL) and at least one of an acid 314 and a dopant 316, where the mixing 310 results in the formation of a solution 318. In some embodiments of the present disclosure, the hole-transport material 312 may include spiro-OMeTAD. Examples of an acid 314 that may be used in some embodiments of the present disclosure include at least one of an organic acid and/or an inorganic acid. Examples of organic acids include acetic acid, citric acid, formic acid, lactic acid, oxalic acid, a sulfonic acid, a phosphonic acid, and/or a carboxylic acid. A sulfonic acid is benzenesulfonic acid. A phosphonic acid is phenylphosphonic acid. Examples of inorganic acids include HCl, HBr, HI, $HNO_3$, $H_3PO_4$, $H_3PO_3$, $H_2SO_4$, and/or $H_2SeO_4$. The acid 314 may be provided during the mixing 310 to produce a concentration of the acid 314 relative to the hole-transport material 312 between 1 mol % and 75 mol %. In some embodiments of the present disclosure, the acid 314 may be provided to the mixing 310 in a neat form (e.g. pure) and/or diluted in a solvent (e.g. water).

Referring again to FIG. 3, the mixing 310 may include a dopant 316 with examples of a dopant 316 including at least one of an alkaline salt, a Co(III) salt, 2,3,5,6-tetrafluoro-7,7,8,8-tetracyanoquinodimethane, $SnCl_4$, Ag-bis(trifluoromethanesulfonyl)imide (Ag-TFSI), N-butyl-N'-(4-pyridylheptyl)imidazolium bis(trifluoromethane)sulfonimide (BuPyIm-TFSI), and/or $N(PhBr)_3SbCl_6$. Examples of an alkaline salt include at least one of Li-TFSI, Na-TFSI, K-TFSI, $LiSO_3F$, $NaSO_3F$, $KSO_3F$, $LiSbF_6$, $NaSbF_6$, $KSbF_6$, $LiPF_6$, $NaPF_6$, and/or $KPF_6$. Examples of a Co(III) salt include at least one tris(2-(1H-pyrazol-1-yl)-4-tert-butylpyridine)cobalt(III) tri[bis(trifluoromethane)sulfonimide] (FK209), tris(2-(1H-pyrazol-1-yl)pyridine)cobalt(III) tri[bis(trifluoromethane)sulfonamide (FK102), bis(2,6-di(1H-pyrazol-1-yl)pyridine)cobalt(III) tri[bis(trifluoromethane)sulfonimide] (FK269), and/or tris(2-(1H-pyrazol-1-yl)pyrimidine)cobalt(III) tri[bis(trifluoromethane)sulfonimide] (MY11). The solvent 317 may include at least one of a polar solvent and/or a non-polar solvent. Examples of polar solvents include methanol, ethanol, butanol, propanol, and/or acetonitrile. Examples of non-polar solvents include toluene, dimethyl-benzene, chlorobenzene, di-chlorobenzene, hexane, tetrachloromethane, and/or dichloromethane.

In some embodiments of the present disclosure, the mixing 310 may be performed at a temperature between 0° C. and 100° C., or between 20° C. and 30° C. The mixing 310 may occur by simple diffusion of the constituent components contained in the solution 318 and/or the mixing 310 may be accelerated using mechanical mixing, for example an agitator. Thus, in some embodiments of the present disclosure, the mixing 310 may be achieved in a stirred-tank reactor and/or using a static mixer. The mixing 310, during which the constituent components are added together, may be performed over any suitable amount of time and may be for a period between 1 minute and 100 hours, or between 5 minutes and 5 hours. For example, the constituent components included in the mixing 310, the hole-transport material 312, the acid 314, the dopant 316, and/or the solvent 317 may all be added together at essentially the same time (e.g. to a stirred-tank reactor and/or co-fed through a static mixer). In some embodiments of the present disclosure, the mixing 312 (the combining of the constituent components) may be performed over a period of time. For example, the mixing 300 may be performed in a series of sequential, intermediate steps that includes a first mixing, over a first period of time, of the hole-transport material 312 with a solvent 317, followed by a second mixing of the acid 314 and/or the dopant 316 to the solution 318, completed over a second period of time. In other examples, the mixing 310 may proceed with incremental additions of one or more of the constituent components to the solution 318, such that the target concentrations of one or more of the constituent components are not achieved immediately, but attained gradually and incrementally over a period of time. In addition, at any point during the mixing and/or once the desired amounts of each constituent component has been achieved, the mixing 312 may be maintained for an intermediate and/or additional period of time. Intermediate and/or additional periods of time may be between 1 minute and 100 hours, or between 5 minutes and 5 hours.

Referring again to FIG. 3, after the mixing 310 the method 300 may continue with the separating 320 of undissolved solids contained in the solution 318 to form a solid 322 and a liquid 324. The separating 320 may be achieved using any suitable unit operation including filtration, centrifugation, and/or electrostatic separation techniques. In some embodiments of the present disclosure, the separating 320 may remove a solid 322 that is up to 5 wt % relative to the liquid 324. However, it should be understood that the amount of solid 322 removed from the solution 318 will depend on the solubilities of the various constituent components in the solution 318. In some embodiments of the present disclosure, the separating 320 may be accomplished using a filtration system having a filter membrane with a pore size less than or equal to 1.0 micron, or less than or equal to 0.2 microns. In some embodiments of the present disclosure, the separating 320 may be accomplished by centrifuging the solution 318 at up to 1000 rpm for up to 1 hour. The separating 320 may be performed at the temperature that the mixing 300 was performed at, or at lower temperatures; e.g. between 0° C. and 100° C., or between 20° C. and 30° C. In some embodiments of the present disclosure, the method 300 may not involve the separating 320, for example, when solids are not present at a sufficient concentration to warrant the separating 320.

After the separating 320, the method 300 may continue with the applying 330 of the liquid 324 to a surface of a perovskite layer of an intermediate device 332 (e.g. a device having a perovskite layer positioned on an ETL) resulting in the formation of a device having a liquid layer 334 on the surface. The applying 330 of the liquid 324 may be achieved by any suitable solution processing method, with examples including spin-coating, dip-coating, curtain-coating, blade coating, slot-die coating, screen printing, inkjet printing, and/or spray coating. The applying 330 may be achieved at any suitable temperature; e.g. between 0° C. and 100° C., or between 20° C. and 30° C.

After the applying 330, the device having a liquid layer 334 may be treated by removing 340 at least a portion of the liquid layer to produce volatiles 344 and a device having a solid HTL 350 on the surface of the perovskite. Thus, the removing 340 may include heating the device having the liquid layer 334 and/or by exposing the device 334 to a flow of gas capable of sweeping away the portion of the liquid layer and/or absorbing the portion of the liquid layer. The removing 340 essentially facilitates the evaporation of at least a portion of the liquid contained in the liquid layer on the perovskite surface; e.g. removes solvent (e.g. water, a polar solvent, and/or a non-polar solvent) from the liquid layer to form the solid HTL layer. In some embodiments of the present disclosure, the removing 340 may be performed by heating the device having the liquid layer 334 to a temperature between 40° C. and 250° C., or between 40° C. and 100° C.

In some embodiments of the present disclosure, the applying 330 and the removing 340 may be repeated a number of times to increase the thickness of the HTL positioned on the perovskite layer. For example, the applying 330 and the removing 340 may be repeated between 1 and 20 times, or between 1 and 5 times, resulting in a device having a HTL with a thickness between 10 nm and 1000 nm, or between 50 nm and 500 nm.

Referring again to FIG. 3, in some embodiments of the present disclosure, the method 300 may include forming (not shown) at least one of an ETL 230 through techniques including spray-pyrolysis, atomic-layer-deposition, electrodeposition, sputtering, anodic-oxidation, spin-coating, and/or screen-printing. The perovskite layer 220 may be formed through techniques including at least one of spin-coating, blade-coating, spray-coating, slot-die coating, ink-jet printing, screen-printing, close-spaced sublimation, sequential-deposition, and/or thermal-evaporation, prior to the applying 320 of the solution onto a surface of the perovskite layer. Other methods may include the forming (not shown) of a first charge collecting layer 240, followed by the forming (not shown) of an ETL layer 230 on the first charge collecting layer 240. As will be demonstrated below, the addition of an acid to a HTL and/or a hole-transport material may promote the oxidation of the HTL and/or hole-transport material. This oxidation may occur during any of the steps illustrated in FIG. 3 and described above; e.g. during at least one of the mixing 310, the separating 320, the applying 330, and/or during the removing 340. In some embodiments of the present disclosure, oxidation of the HTL and/or hole-transport material begins during the mixing 310 and continues during the removing 340.

As described above, the present disclosure relates to the use of acids (e.g. $H_3PO_4$) with or without at least one dopant to improve, among other things, the conductivity of HTLs (e.g. spiro-OMeTAD). For example, the use of acids in combination with Li-TFSI and/or Co(III) salts as dopants, are shown herein to improve the performance characteristics of HTLs in PSCs (e.g. perovskite-containing devices). The addition of an acid to a hole-transport material (e.g. spiro-OMeTAD) is shown herein to improve the overall PSC performance, primarily through increased open-circuit voltage ($V_{OC}$) and fill factor (FF). The performance enhancement was demonstrated for a wide range of acids with different $pK_a$ and counter-ion identity. UV-Vis and conductivity measurements show that acids, in the presence of an alkaline salt, can catalyze the oxidation of a hole-transport material, for example spiro-OMeTAD. $^1H$ NMR and ultra-violet photoelectron spectroscopy (UPS) results show hydrogen bonding interactions between acids and spiro-OMeTAD as a potential cause for the enhanced conductivities. In addition, device hysteresis is significantly suppressed in PSCs having hole-transport layers treated with an acid and/or containing an acid. Thus, in some embodiments of the present disclosure, acidic additives are proposed as a strategy for enhancing the conductivity of hole-transport layers (e.g. spiro-OMeTAD) for developing high-efficiency, low-hysteresis $TiO_2$-containing planar PSCs.

In some embodiments of the present disclosure, moderate acids may present advantages over stronger acids (e.g. H-TFSI (pKa=−11.9)), as stronger acids may present considerable difficulties in handling and in large scale applications. A variety of moderate acids as additives have been tested, specifically in spiro-OMeTAD HTL formulations, resulting in improved efficiencies of the final PSCs, as well as reduced hysteresis. This effect is shown to be compatible with various doping strategies. Thus, this works shows that the use of acids as additives provide useful methods for enhancing the conductivity of HTLs, especially in PSCs.

Figure 4:
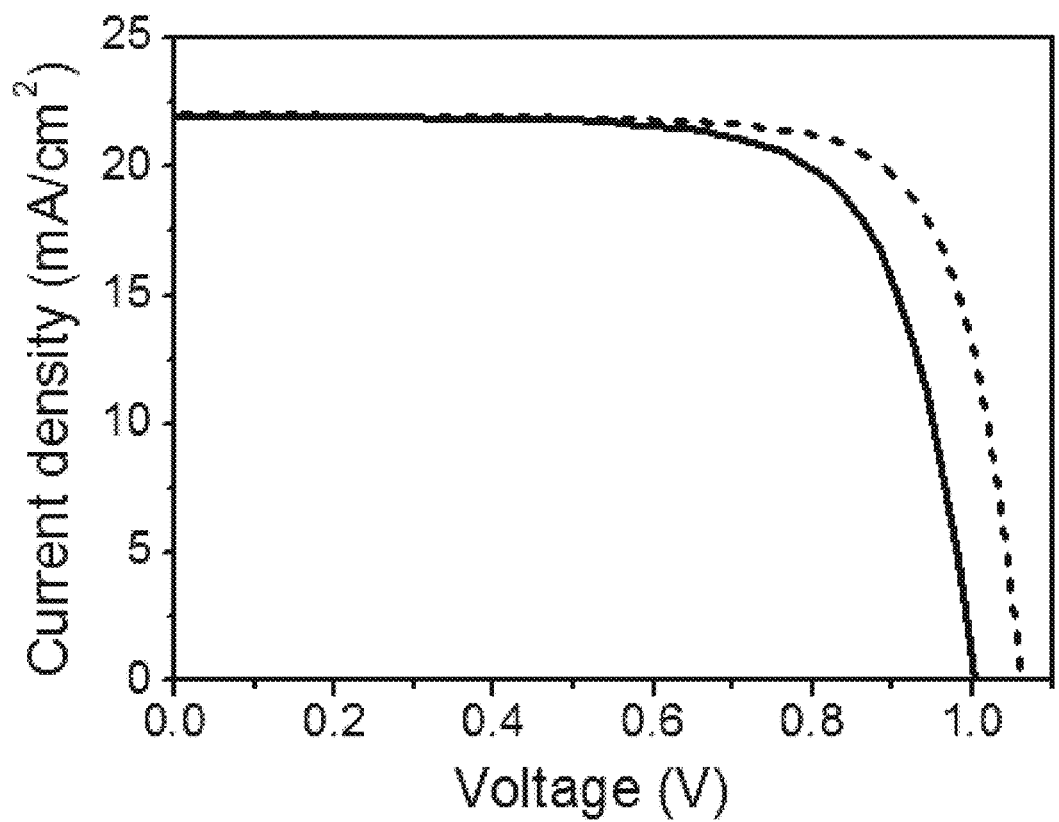
FIG. 4 illustrates the effects of $H_3PO_4$ as an additive to a spiro-OMeTAD HTL on the light J-V performance curves of PSCs utilizing these HTLs, according to some embodiments of the present disclosure.
Figure 5:
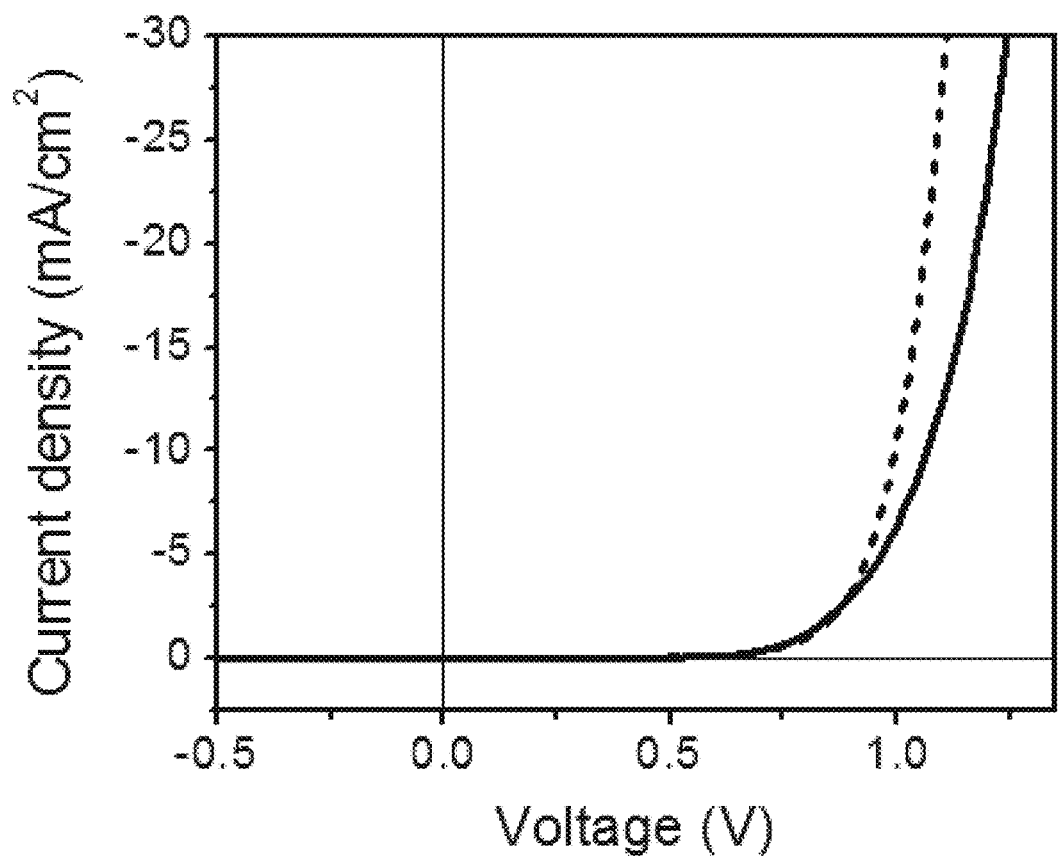
FIG. 5 illustrates the effects of $H_3PO_4$ as an additive to a spiro-OMeTAD HTL on the dark J-V performance curves of PSCs utilizing these HTLs, according to some embodiments of the present disclosure.

The effects of adding an acid to a hole-transport material are evident by comparing the photocurrent density-voltage (J-V) characteristics for PSCs with acid (dashed line) and without acid (solid line) in a spiro-OMeTAD HTL formulation (see FIG. 4). Two types of PSCs were fabricated with the same procedures except for the addition of an acid to the spiro-OMeTAD material/formulation/layer. The standard (reference) device used an HTL recipe where spiro-OMeTAD was doped with Li-TFSI and tert-butylpyridine (tBP). Phosphoric acid ($H_3PO_4$) was added to the spiro-OMeTAD solution of the acid-containing device, with the same amount of tBP and Li-TFSI in its recipe as in the reference device. The PSC that included the HTL with acid outperformed the reference device without the acid, as demonstrated by an increase in power conversion efficiency (PCE) from 15.9% to 17.8%. This performance improvement is partly due to increased open-circuit voltage ($V_{OC}$) and fill-factor (FF). FIG. 5 illustrates the dark current-voltage (J-V) curves of the two PSCs tested; e.g. with acid (dashed line) and without acid (solid line) in the HTL. The addition of acid to the hole-transport material resulted in a decrease in the series resistance ($R_s$) from 7.45 $\Omega \cdot cm^2$ for the reference device to 3.17 $\Omega \cdot cm^2$ for the acid-containing device. This improvement was determined to be applicable to a wide range of acids (e.g., HCl, HBr, HI, $HNO_3$, $H_3PO_4$, $H_3PO_3$, $H_2SO_4$, $H_2SeO_4$, acetic acid, citric acid, formic acid, lactic acid and oxalic acid, sulfonic acids, phorsphonic acids, and/or carboxylic acids).

Figure 6:
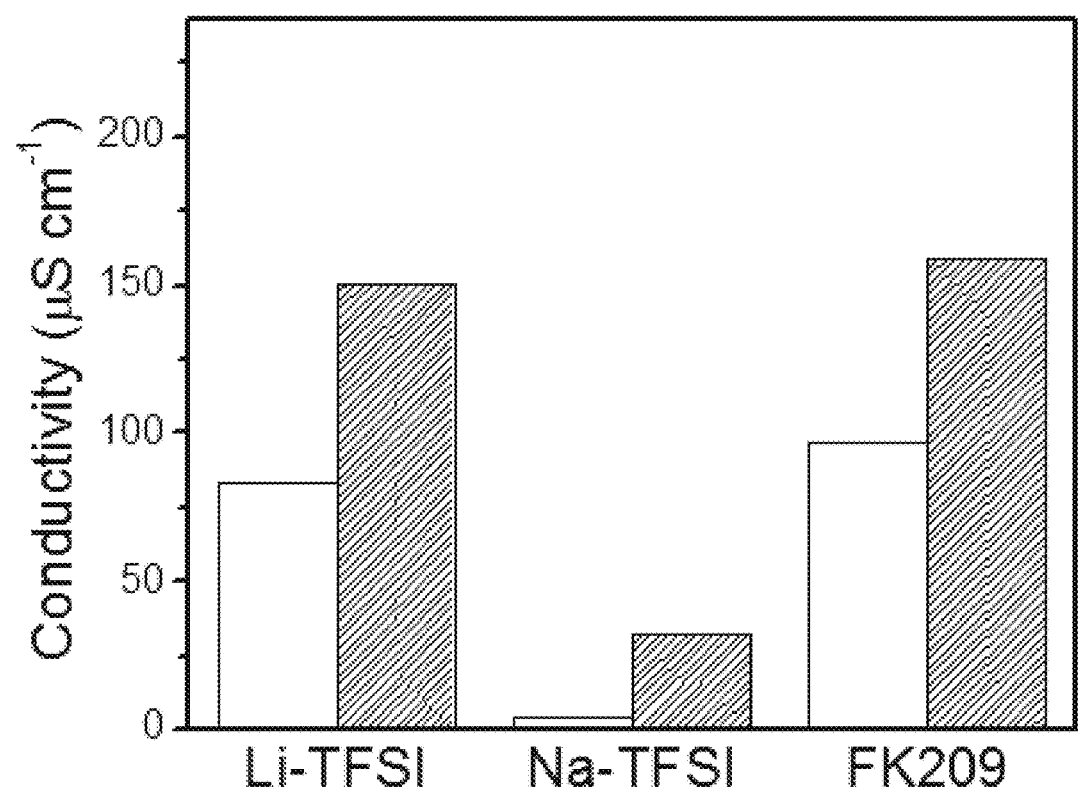
FIG. 6 illustrates the conductivity of spiro-OMeTAD HTLs with different dopants, according to some embodiments of the present disclosure.

The decreased $R_s$ observed in PSCs using acid-containing HTLs implies an increase in the HTL conductivity. This is verified by direct measurements of the conductivities of spiro-OMeTAD layers constructed using different combination of dopants/additives as shown in FIG. 6 (filled bars—with $H_3PO_4$; empty—without $H_3PO_4$). The use of phosphoric acid ($H_3PO_4$) as an additive increased the conductivity for each of the three types of dopants evaluated in this test: (1) an alkaline salt, for example at least one of Li-TFSI, Na-TFSI, K-TFSI, $LiSO_3F$, $NaSO_3F$, $KSO_3F$, $LiSbF_6$, $NaSbF_6$, $KSbF_6$, $LiPF_6$, $NaPF_6$, and/or $KPF_6$ and so on; (2) a Co(III) salt, for example at least one of FK209, FK102, FK269, MY11 and so on; and (3) any other suitable oxidant dopants, for example at least one of $F_4TCNQ$, $SnCl_4$, Ag-TFSI, BuPyIm-TFSI, $N(PhBr)_3SbCl_6$ and so on. In particular, the conductivity of acid-containing Li-TFSI doped HTLs increased from 83.7 µS/cm to 150.9 µS/cm. This is consistent with the lower $R_s$ based on the analysis from the J-V curves.

Figure 7:
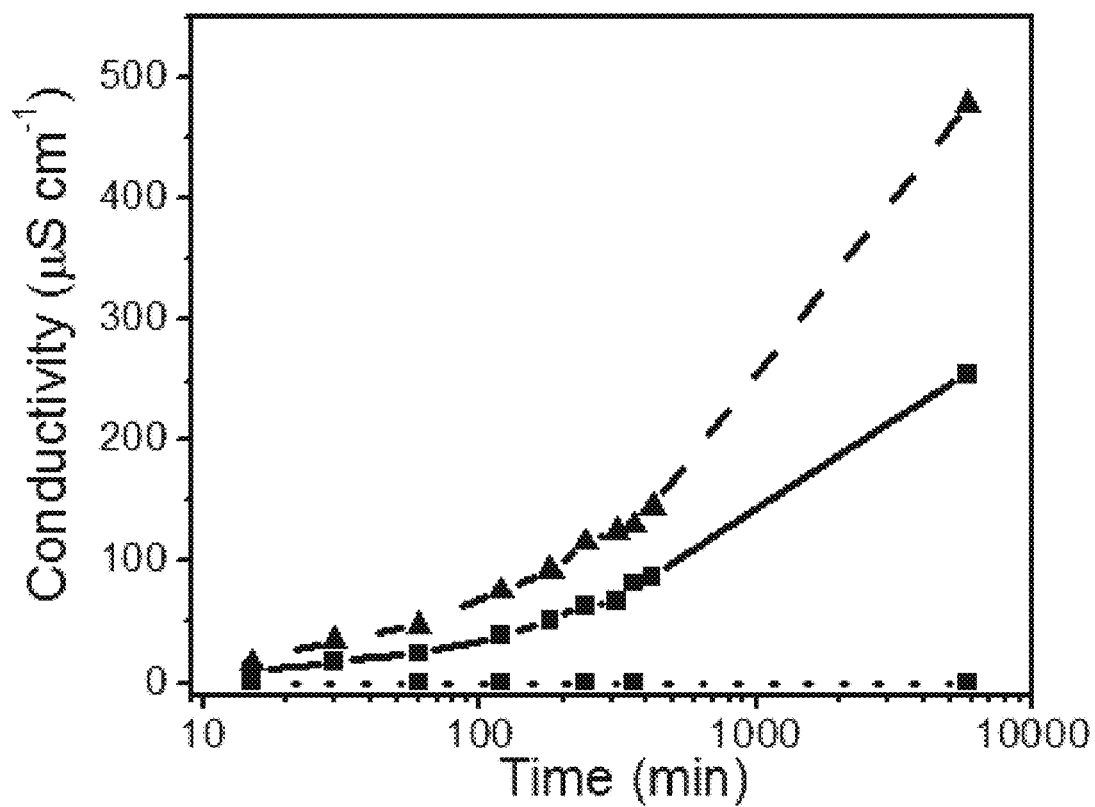
FIG. 7 illustrates the conductivity of spiro-OMeTAD HTLs as function of aging time, where the films were stored in a dry air environment, according to some embodiments of the present disclosure.

FIG. 7 examines the effects of time (e.g. aging) by tracking the conductivity of HTLs as a function of time while in an air environment (squares/dashed-line—$H_3PO_4$; squares/solid line—Li-TFSI; triangles/dashed line—Li-TFSI+$H_3PO_4$). Although the addition of $H_3PO_4$ clearly enhanced the conductivity of a spiro-OMeTAD-containing HTL, the acid alone did not appear to be sufficient to improve the conductivity of spiro-OMeTAD. Instead, the spiro-OMeTAD HTL treated with only $H_3PO_4$ exhibited a low conductivity that was similar to pristine spiro-OMeTAD and the low conductivity did not change over time with exposure to air. These results also illustrate that Na-TFSI alone appeared to be insufficient at improving the conductivity of spiro-OMeTAD, whereas the addition of $H_3PO_4$ in conjunction with Na-TFSI to spiro-OMeTAD, resulted in an increased conductivity in the hole-transport material (see FIG. 6).

These results suggest that acid, in the presence of an alkaline salt, may catalyze the oxidation of spiro-OMeTAD. Thus, without wishing to be bound by theory, it is theorized that the use of an acid may promote the reaction between an alkali salt and a superoxide radical (generated by oxidation of spiro-OMeTAD by ambient oxygen), which may then shift the reaction's equilibrium to the oxidation of spiro-OMeTAD. This hypothesis would explain the slow oxidation process observed in PSCs using spiro-OMeTAD doped with Li-TFSI, which normally exhibit poor initial PCE performance and typically require days of aging in air to reach maximum performance. Thus, the aging time necessary to reach a maximum HTL conductivity in some hole-transport materials may be greatly shortened by using devices having HTLs that utilize acid-containing hole-transport materials, e.g. spiro-OMeTAD.

Figure 9:
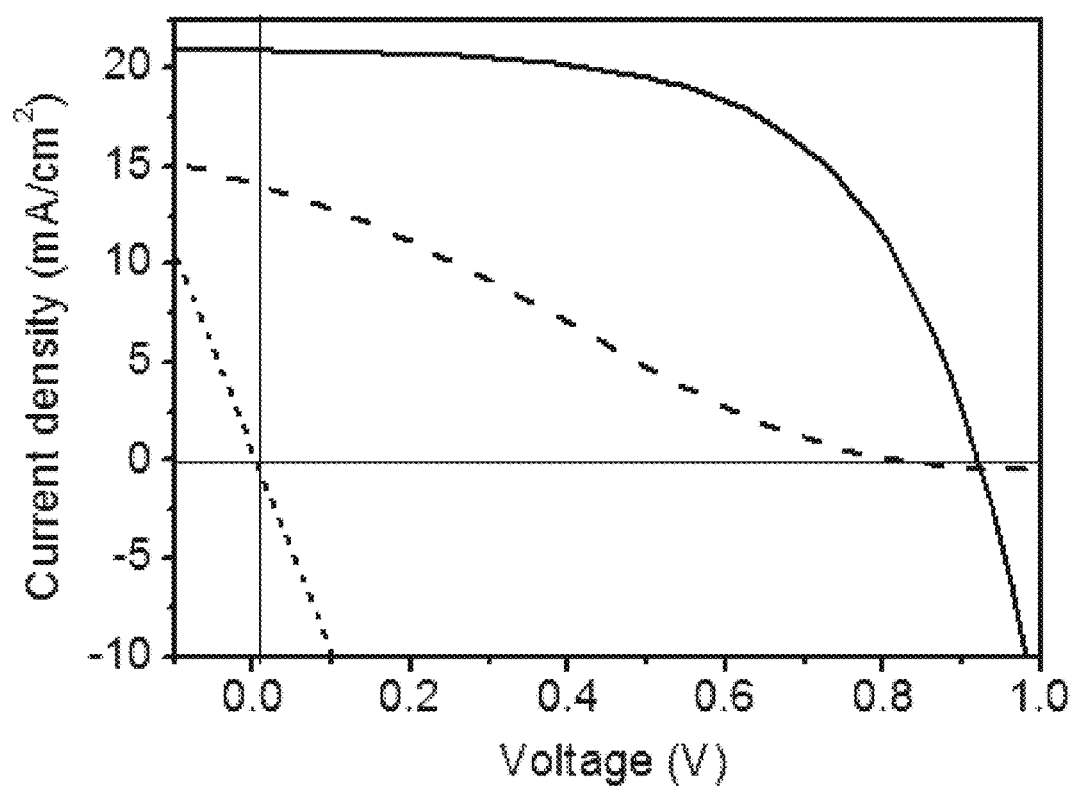
FIG. 9 illustrates light J-V characteristics of PSCs with different dopants in spiro-OMeTAD measured on the same day as device fabrication, according to some embodiments of the present disclosure.

FIG. 9 shows the J-V curves of PSCs fabricated with spiro-OMeTAD-containing HTLs utilizing different additives (short-dashes—pure $H_3PO_4$, long-dashes—Li-TFSI, and solid line—mixture of Li-TFSI and $H_3PO_4$). Efficiencies were measured immediately after device fabrication. The device fabricated using an HTL containing only $H_3PO_4$ showed a resistor-like response with essentially no photovoltaic performance ($V_{OC}$<50 mV), which is consistent with the observation that acid alone appears to be insufficient to increase the performance of a spiro-OMeTAD HTL. The conductivity of spiro-OMeTAD doped with Li-TFSI required days of aging to reach optimal conductivity. Given the short time period exposed to air, the Li-TFSI doped spiro-OMeTAD was still highly resistive, which is evidenced by the S shape of J-V curves at high bias voltage near $V_{OC}$. On the other hand, adding $H_3PO_4$ in combination with the Li-TFSI appears to have accelerated the oxidation of the spiro-OMeTAD HTL and the device already showed a good performance as evidenced by the better $V_{OC}$ and FF on the same day of the device fabrication.

Figure 8:
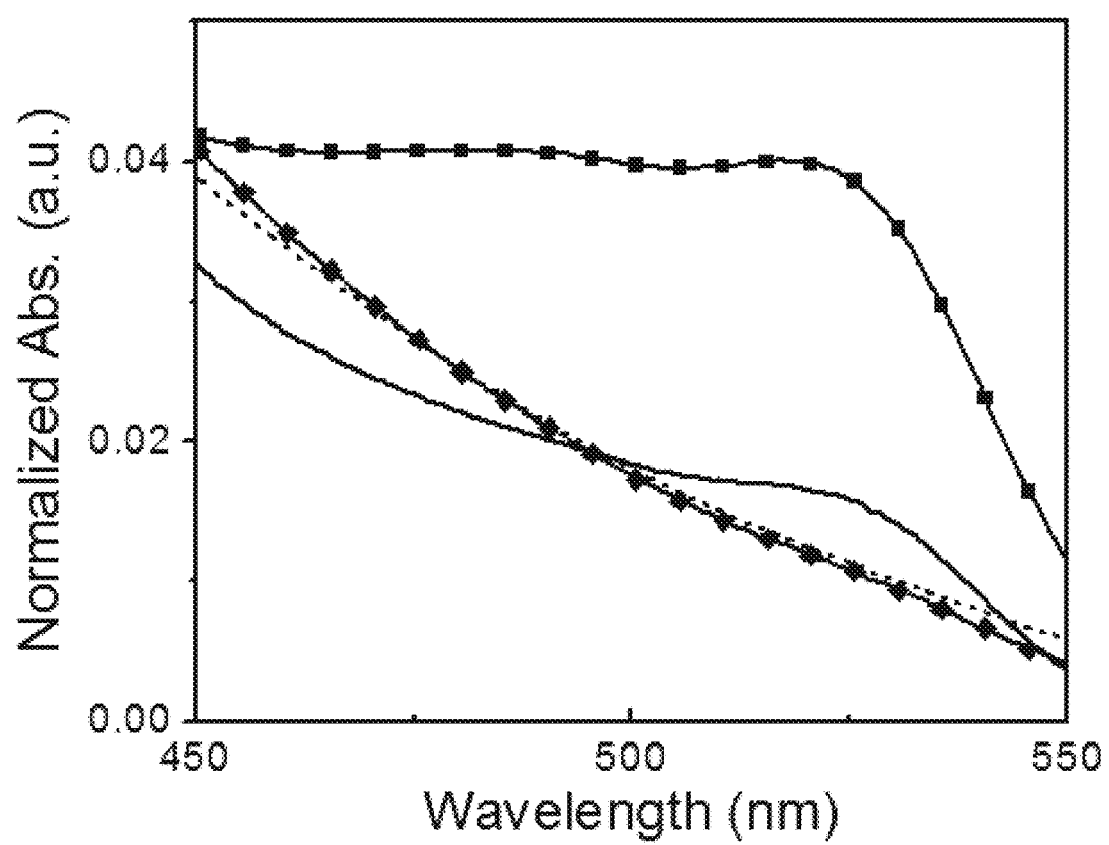
FIG. 8 illustrates UV-Vis spectra of spiro-OMeTAD HTLs as deposited and aged in air for 14 days, according to some embodiments of the present disclosure.

The apparent catalyzing effect of the acid on the oxidation of the HTL, e.g. spiro-OMeTAD, is also evident in the UV-Vis spectra of spiro-OMeTAD layers (see FIG. 8). In general, the oxidation of spiro-OMeTAD introduced a broad absorption peak around 500 nm (arising from the SOMO→LUMO transition of the radical cation), which was distinct from the 395 nm peak of the pristine spiro-OMeTAD. It can be seen that the spiro-OMeTAD treated with the mixture of Li-TFSI and $H_3PO_4$ showed higher absorption around 500 nm than that treated with only Li-TFSI after the same aging period of 14 days, which is evidence of more oxidation occurring in the acid-containing HTL. (Legend for FIG. 8: Li-TFSI: dashed line—as deposited; solid line—14 days; LI-TFSI+$H_3PO_4$: solid line with diamonds—as deposited; solid line with squares—14 days.)

Figure 10:
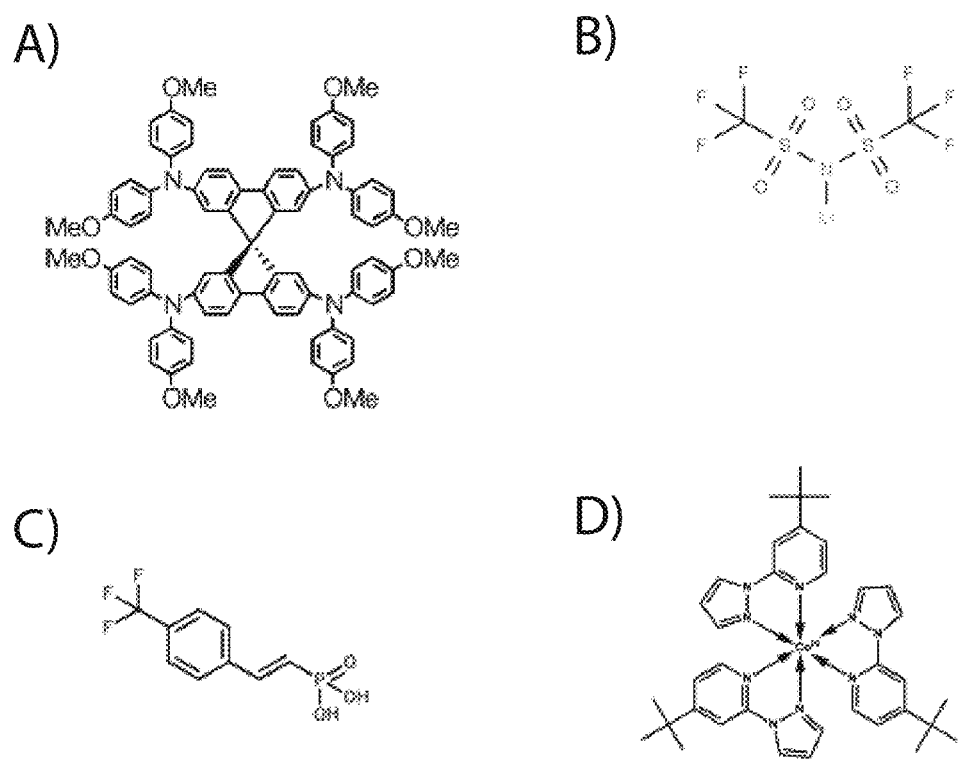
FIG. 10 illustrates the molecular structures of various dopants, according to some embodiments of the present disclosure: (A) spiro-OMeTAD; (B) Li-TFSI; (C) 4-(trifluoromethyl)styryl)phosphonic acid ($CF_3PA$), a specifically synthesized derivative of phosphonic acid with better solubility in spiro-OMeTAD solution; (D) FK209, cobalt (III) TFSI salt.

In contrast to Li-TFSI, the trivalent cobalt salt FK209 (see FIG. 10), directly and rapidly oxidized spiro-OMeTAD. Therefore, spiro-OMeTAD doped with FK209 showed relatively high conductivity without the need for aging the HTL in air. Nevertheless, FIG. 6 shows that adding $H_3PO_4$ still improved the conductivity of the FK209-doped spiro-OMeTAD. These results suggest that acid plays a role that is more than simply facilitating oxidation and doping of spiro-OMeTAD.

Figure 11:
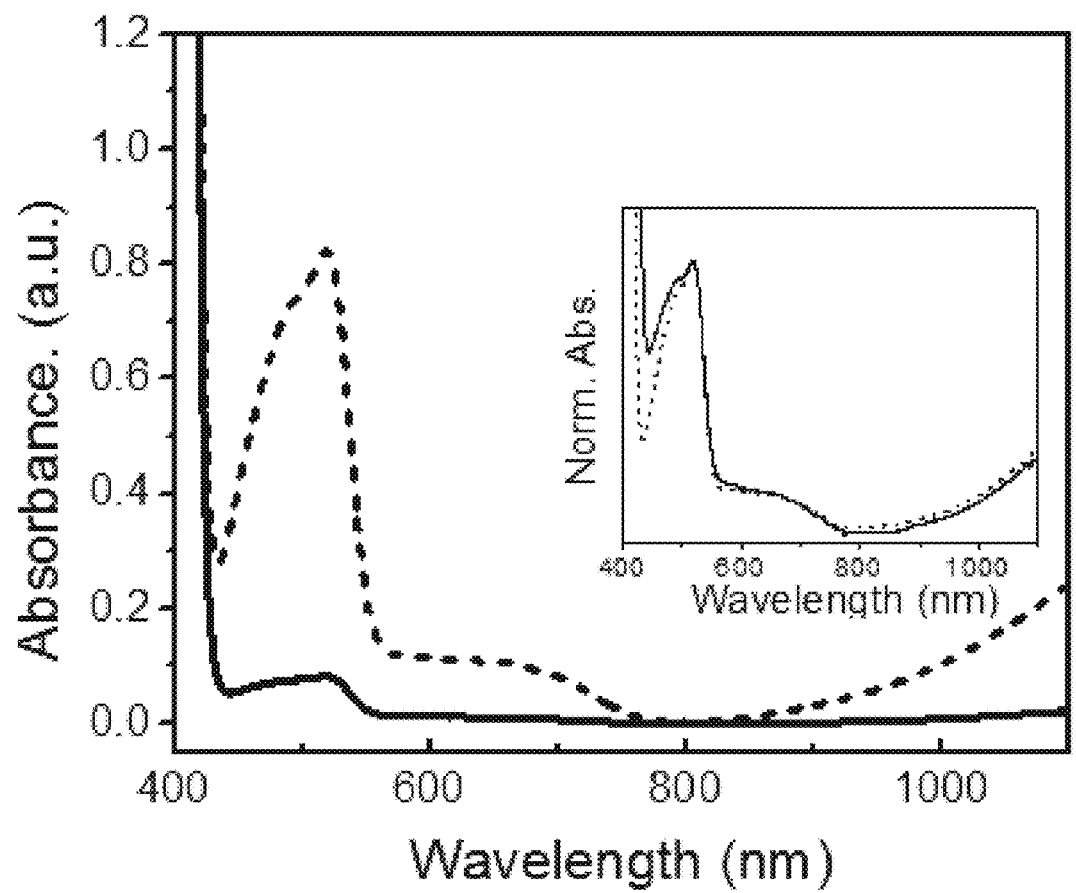
FIG. 11 illustrates UV-Vis spetra of spiro-OMeTAD solutions doped with acid or FK209 Co(III) salt, according to some embodiments of the present disclosure. The inset shows the normalized spectra.
Figure 12:
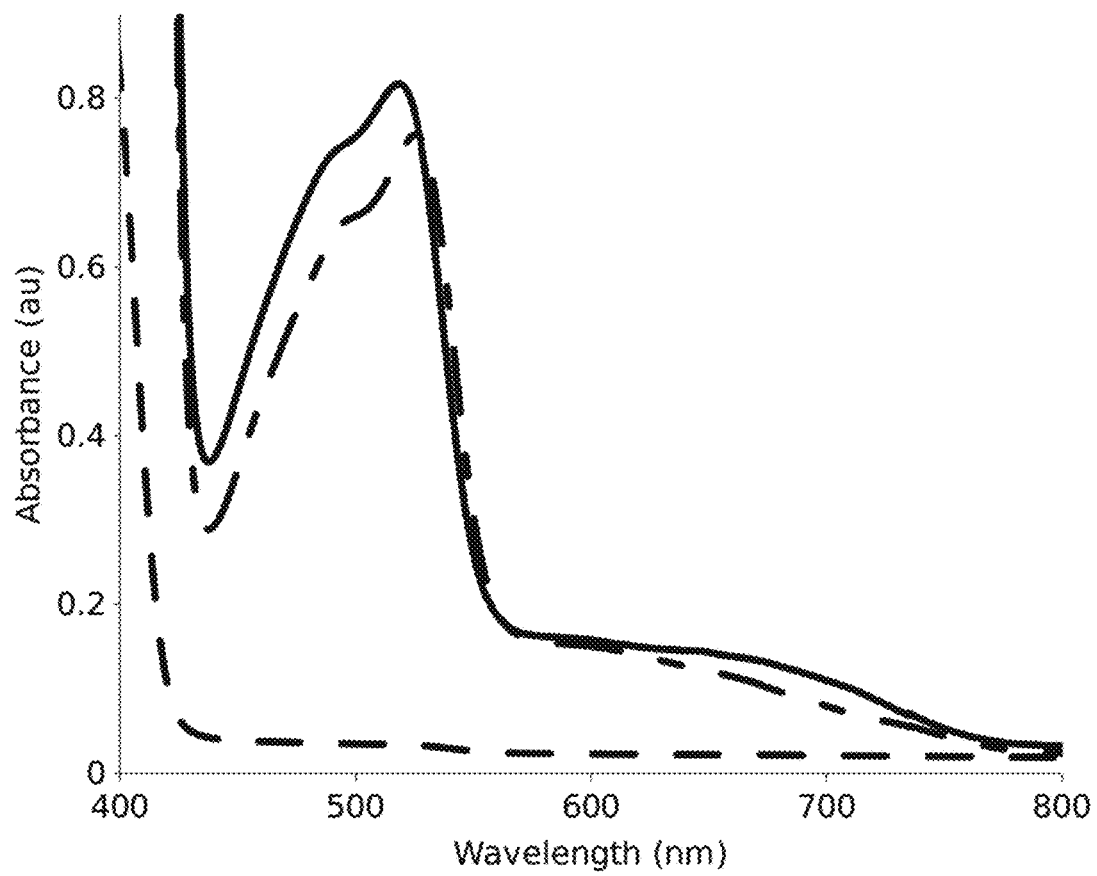
FIG. 12 illustrates UV-Vis spectra of acid-containing spiro-OMeTAD (solution→concentrated film→redissolved solution), according to some embodiments of the present disclosure.
Figure 13:
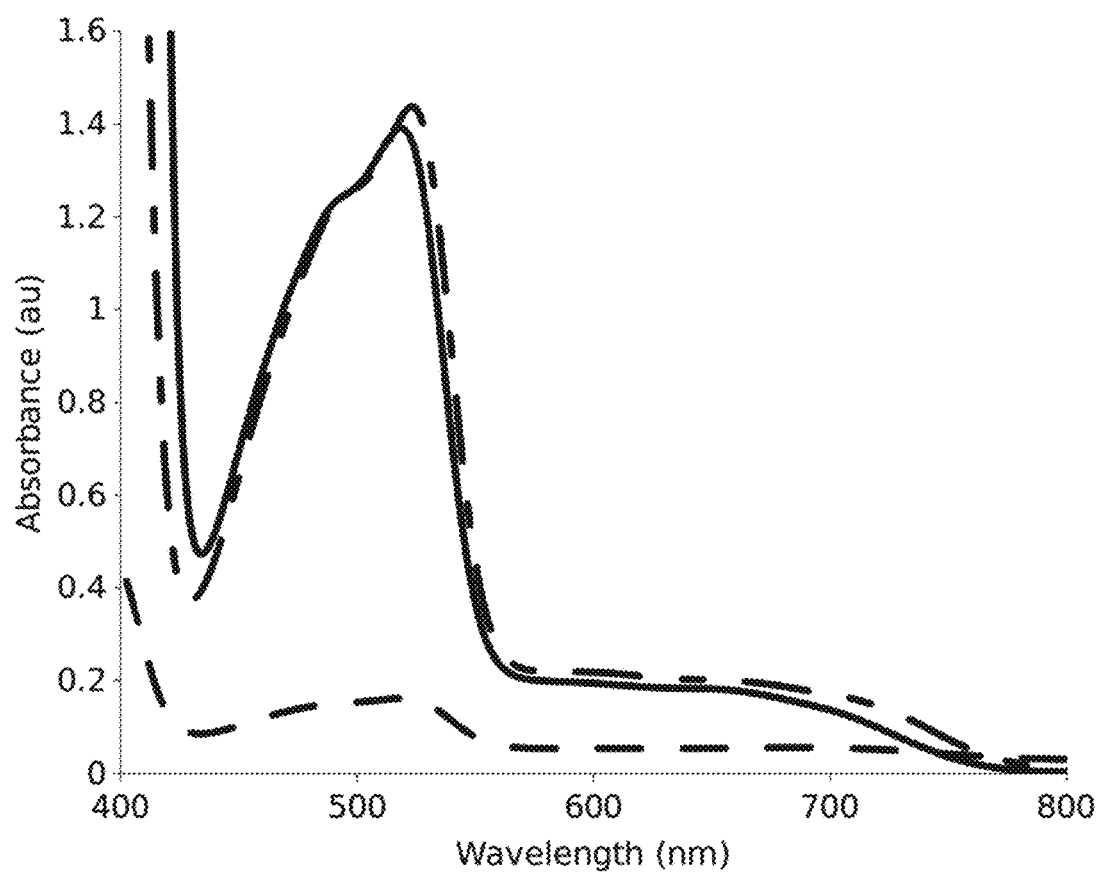
FIG. 13 illustrates UV-Vis spectra of FK209 doped spiro-OMeTAD (solution→concentrated film→redissolved solution), according to some embodiments of the present disclosure.
Figure 14:
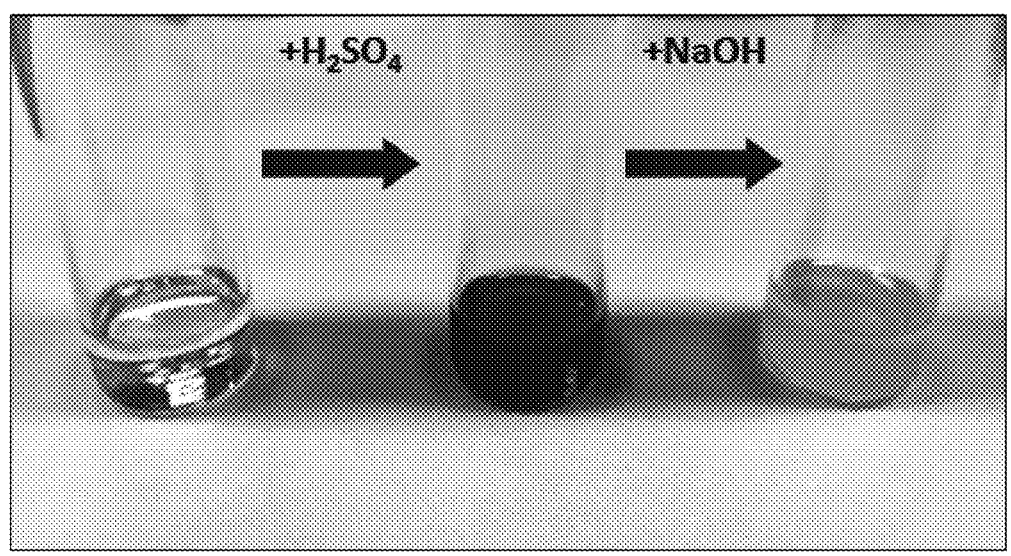
FIG. 14 illustrates the reversible color change of a spiro-OMeTAD-containing solution with acid added and subsequently neutralized by base, according to some embodiments of the present disclosure.

To further understand the role of acid on the conductivity and oxidization of hole-transport materials (e.g. spiro-OMeTAD), UV-Vis absorption and $^1$H NMR measurements of spiro-OMeTAD-containing solutions and/or layers were performed. The UV-vis spectra of oxidized spiro-OMeTAD solutions showed a doublet of peaks around 500 nm (SOMO→LUMO transition), and a large broad absorbance in the red/near-IR (polaron absorbance). Addition of an acid to spiro-OMeTAD-containing solution resulted in a nearly identical spectral signature to the oxidized samples, only much weaker, as seen by the spectra in FIG. 11 (dashed line—Co(III) doped; solid line—with acid). Higher acid concentrations in the samples (either by vacuum drying or by casting into layers) resulted in a color change to a deep-red that can be associated with oxidized spiro-OMeTAD. However, dissolution of these samples reversed the color changes and provided unchanged solution-phase spectra (see FIGS. 12 and 13; solid line—fresh; dashed line—layer; dash-dotted line—redissolved). The color change was reversible and could be removed by neutralization of the solution using a base (see FIG. 14). This is quite different from the relatively stable color of the oxidized spiro-OMeTAD, and implies that there is another interaction between acid and spiro-OMeTAD in addition to the acid-assisted oxidation process.

Figure 15:
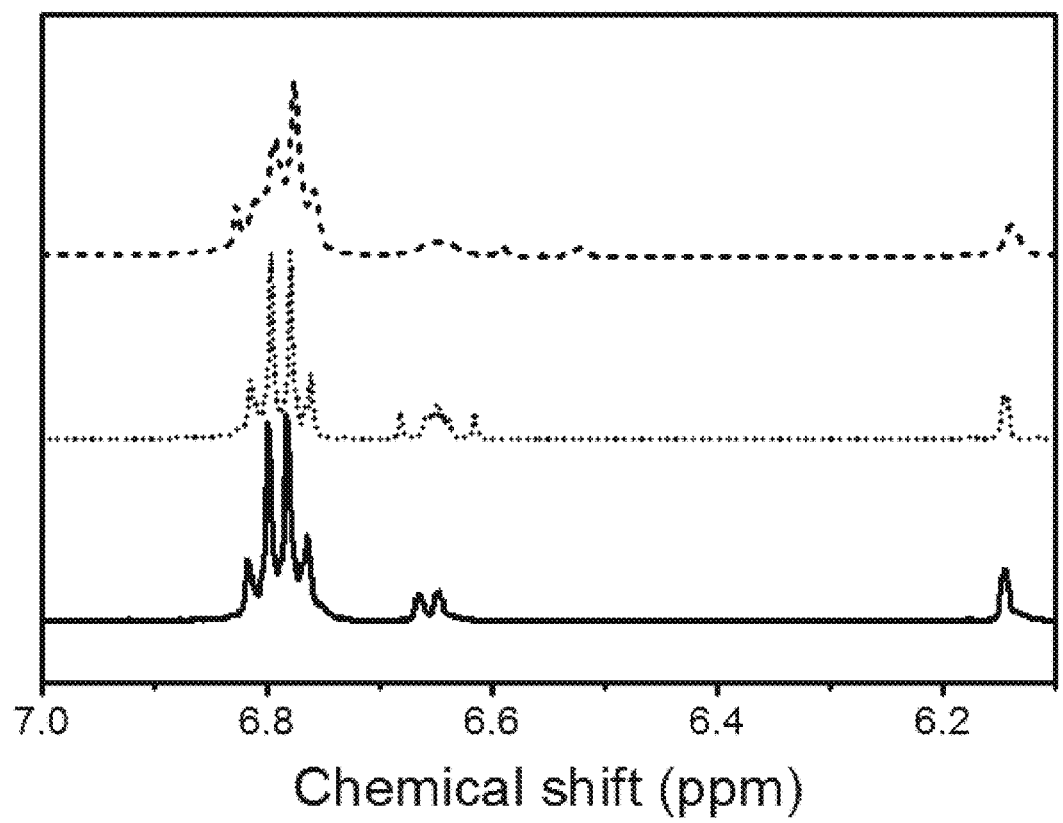
FIG. 15 illustrates $^1H$ NMR spectra of spiro-OMeTAD showing no oxidation change from $CF_3PA$ (4-(trifluoromethyl)styryl)phosphonic acid, a phosphonic acid derivative) and oxidation change from FK209, according to some embodiments of the present disclosure. (top curve—with 25 mol % Co(III); middle curve—with 400 mol % $CF_3PA$; and bottom curve—pristine).
Figure 16:
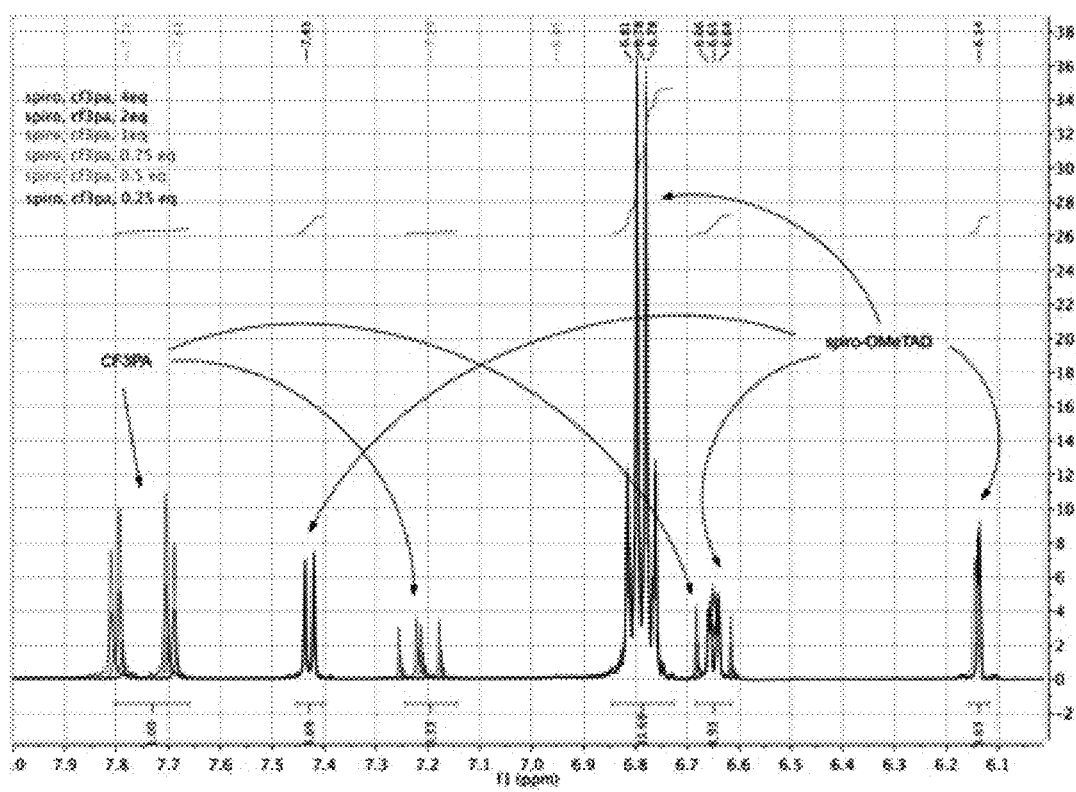
FIG. 16 illustrates an overlay of $^1H$ NMR spectra (from FIG. 17) of spiro-OMeTAD having different amounts of $CF_3PA$, according to some embodiments of the present disclosure.
Figure 17:
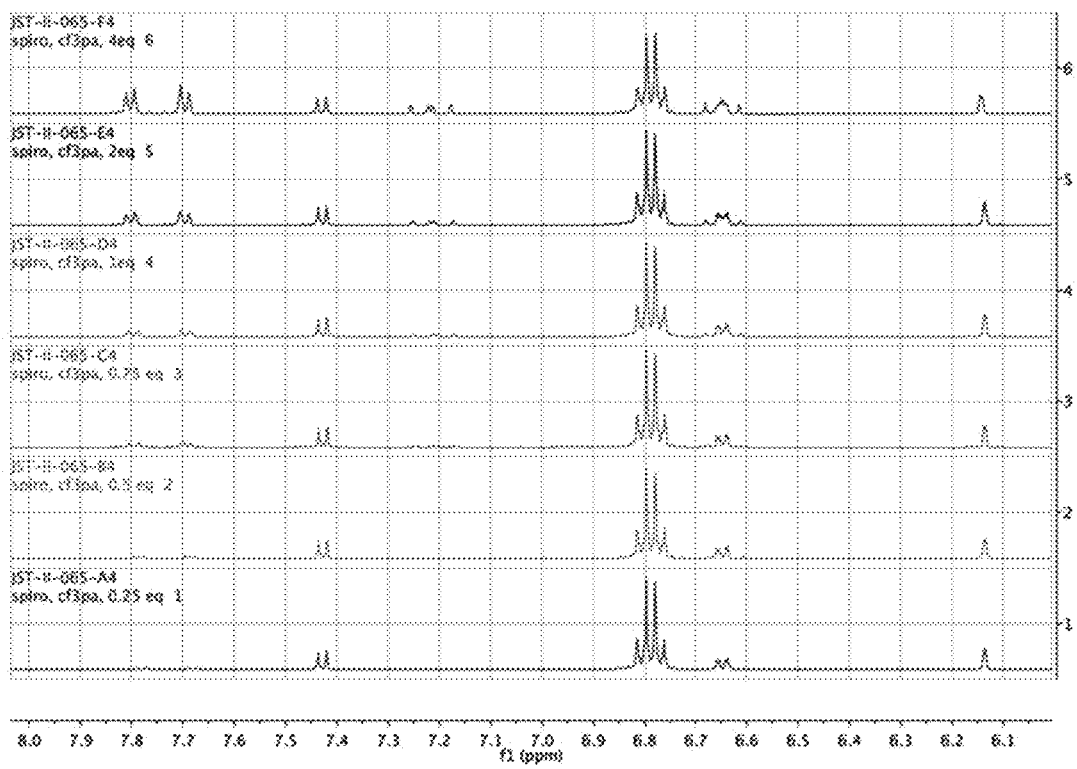
FIG. 17 illustrates stacked $^1H$ NMR spectra of spiro-OMeTAD having different amounts of $CF_3PA$, according to some embodiments of the present disclosure.
Figure 18:
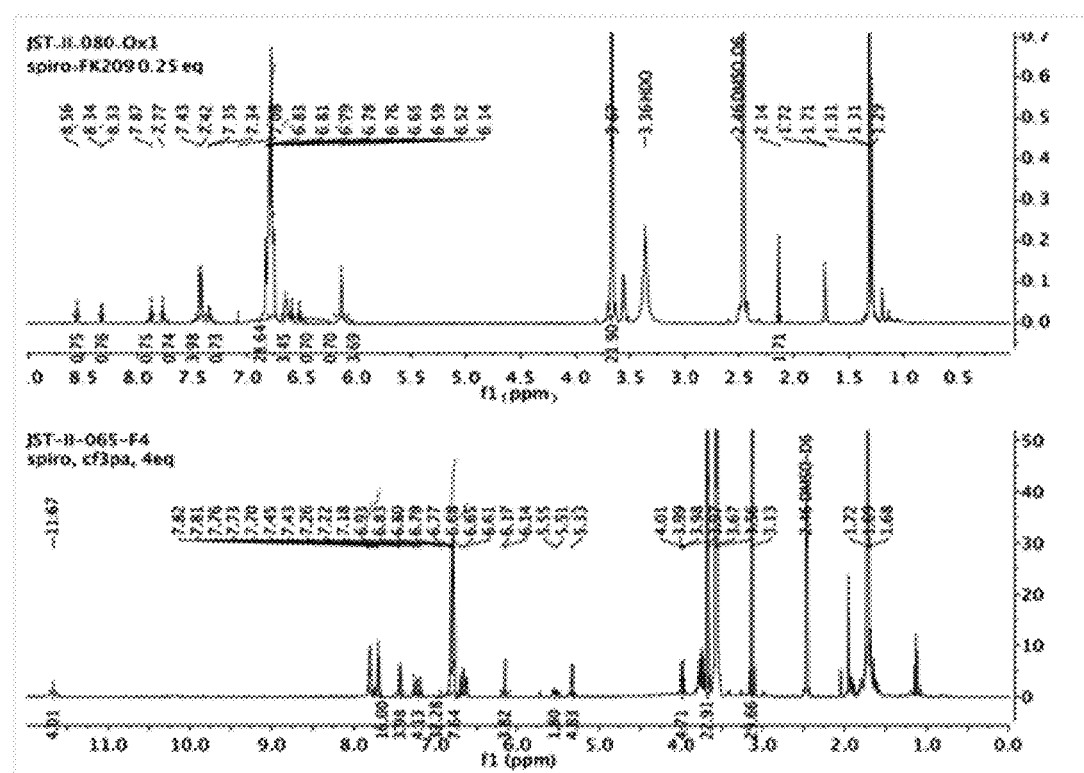
FIG. 18 illustrates full $^1H$ NMR spectra of spiro-OMeTAD containing CF3PA and FK209, according to some embodiments of the present disclosure.

$^1$H NMR analysis of acid-containing samples helps elucidate the nature of acid additives and their interaction with a hole-transport material, e.g. spiro-OMeTAD. In general, and without wishing to be bound by theory, oxidation may introduce a radical cation and cause rapid relaxation of the coupled protons, leading to a decrease in signal intensity of the associated protons. Association of spiro-OMeTAD with an acidic proton can be observed via the shifting of the affected protons. Using 4-(trifluoromethyl)styryl)phosphonic acid ($CF_3PA$), which is a phosphonic acid derivative (see FIG. 10) having strong aromatic proton signals different from spiro-OMeTAD, it was possible to calibrate the proton count between the acid and spiro-OMeTAD to observe if any radical cations are formed. As shown in FIG. 15, all the spiro-OMeTAD protons could be accounted for, and there was no decrease in intensity with increasing amount of acid, even up to 400 mol % of $CF_3PA$ (full spectra illustrated in FIGS. 16 and 17). Similarly, after calibration of the proton count of spiro-OMeTAD versus FK209, it was determined that with just 25 mol % of FK209 there was evidence of oxidation (full spectra illustrated in FIG. 18). The arylamine, and fluorene core peaks around 6.8, 6.7 and 6.2 ppm respectively, showed decreased proton count as well a small upfield shift. Thus, the lack of these changes in the acid ($CF_3PA$) samples is further evidence of the lack of oxidation induced by acid alone and is in agreement with the conductivity and J-V measurements (see FIGS. 7 and 9).

Figure 19:
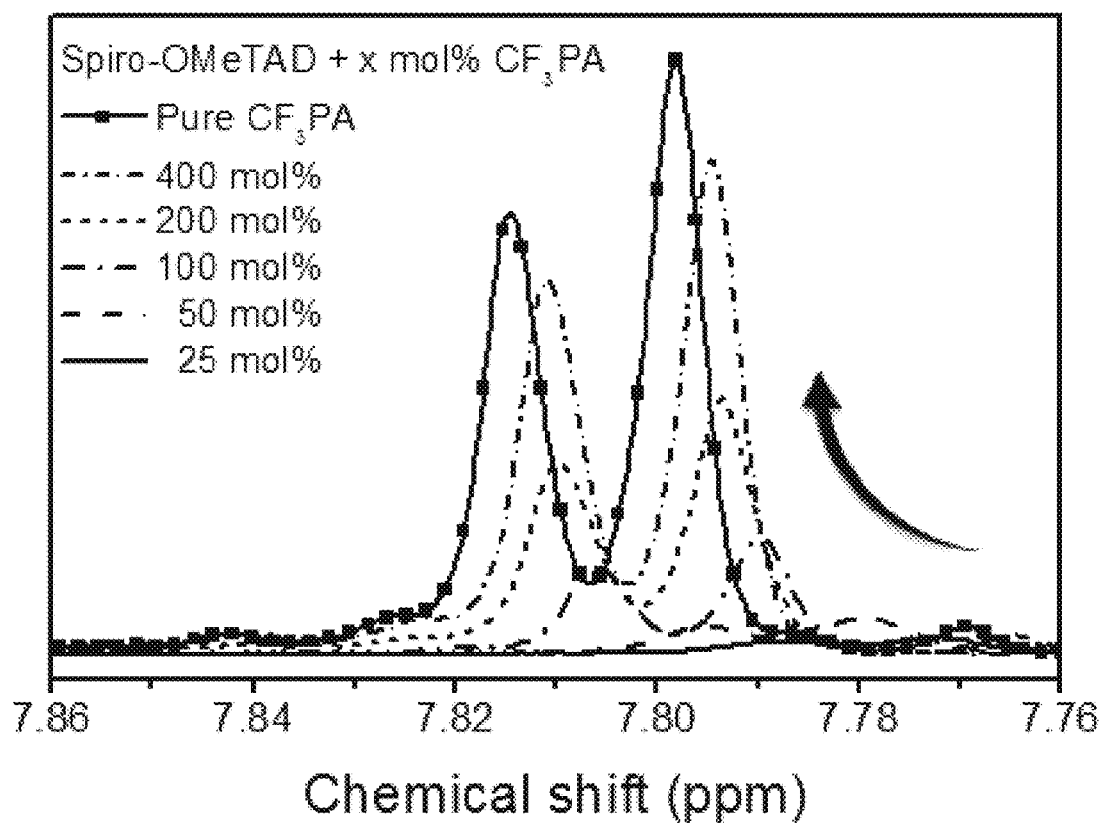
FIG. 19 illustrates the $^1H$ NMR spectra of $CF_3PA$ with different concentrations in spiro-OMeTAD, according to some embodiments of the present disclosure.
Figure 20:
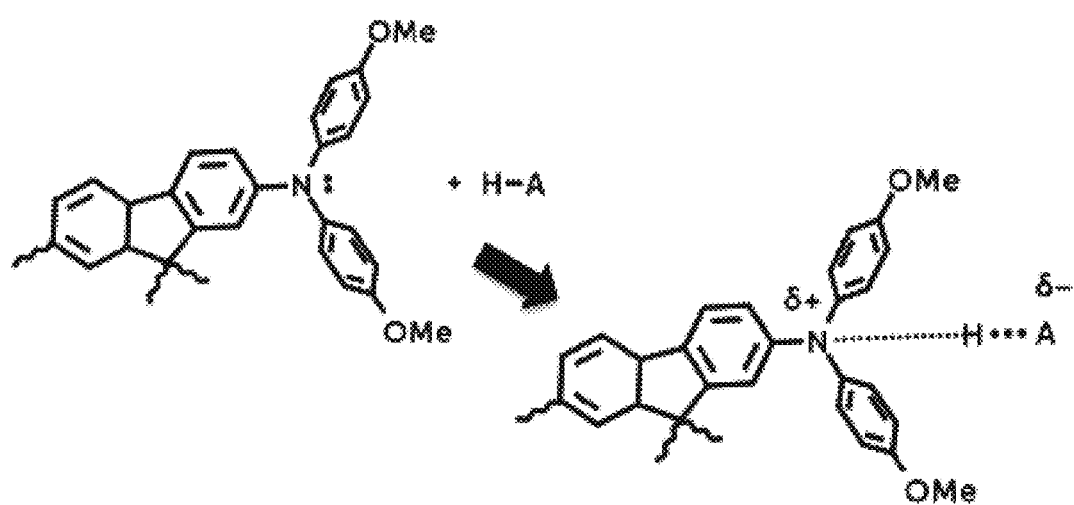
FIG. 20 illustrates a schematic of a possible interaction between $CF_3PA$ acid and spiro-OMeTAD, according to some embodiments of the present disclosure.

Furthermore, the $^1$H NMR measurements of spiro-OMeTAD (see FIGS. 16 and 17) shows that increasing the amount of acid does not lead to a broadening or shifting of the spiro-OMeTAD proton signal as one would normally expect for a protonated species, as protonation will change the chemical environment by withdrawing electron density. This is not surprising considering that triarylamines, especially trimethoxyphenylamine, are not readily protonated. However, the aromatic $CF_3PA$ protons did show an upfield shift with decreasing concentration of acid (see FIG. 19), indicative of increasing proton dissociation. This is despite the lack of corresponding shifts in any of the spiro-OMeTAD proton signals (see FIGS. 16 and 17). Thus, while the acids were apparently unable to fully protonate the amine center or interact with it strongly, it is hypothesized that the acidic proton may be weakly hydrogen-bound to the amine center as shown in FIG. 20, and the increased $CF_3PA$ dissociation is evidence of the increase in number of spiro-OMeTAD molecules associated with the acidic protons. This weak hydrogen bonding may induce partial positive charges in spiro-OMeTAD, which may be responsible for the increased conductivity.

Figure 21:
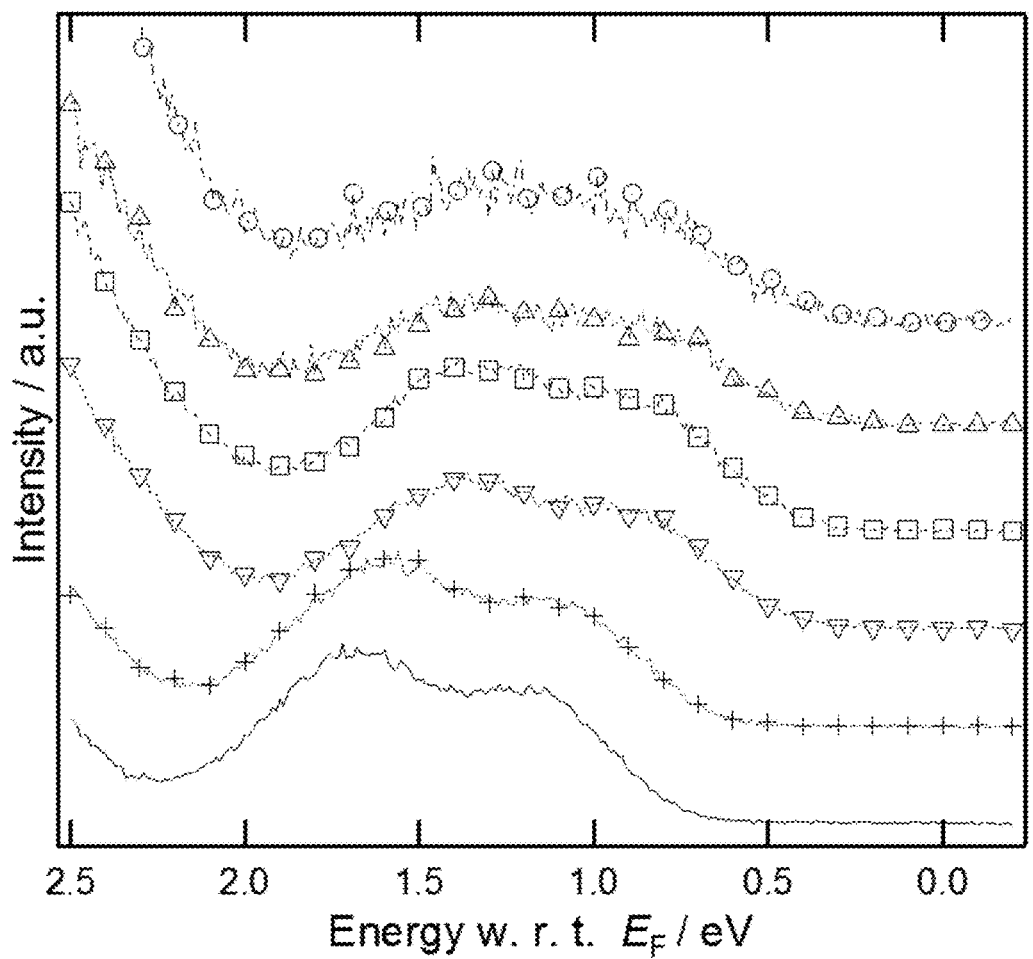
FIGS. 21 and 22 illustrate UPS spectra of spiro-OMeTAD with different dopant/acid combinations, according to some embodiments of the present disclosure.
Figure 22:
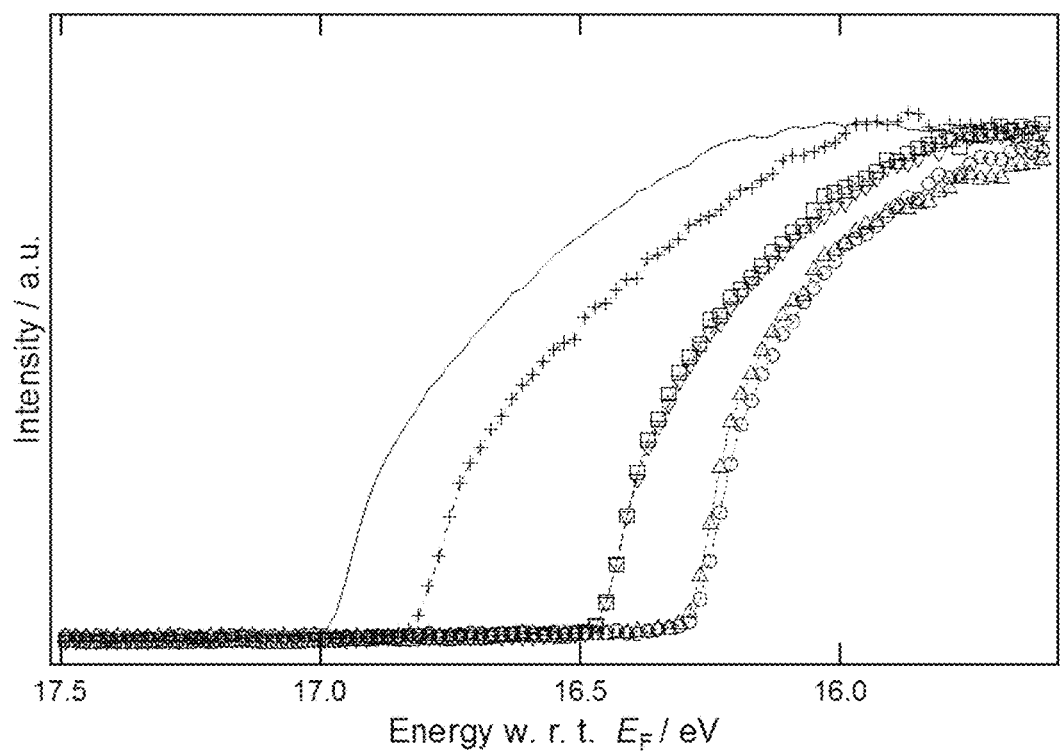
Figure 23:
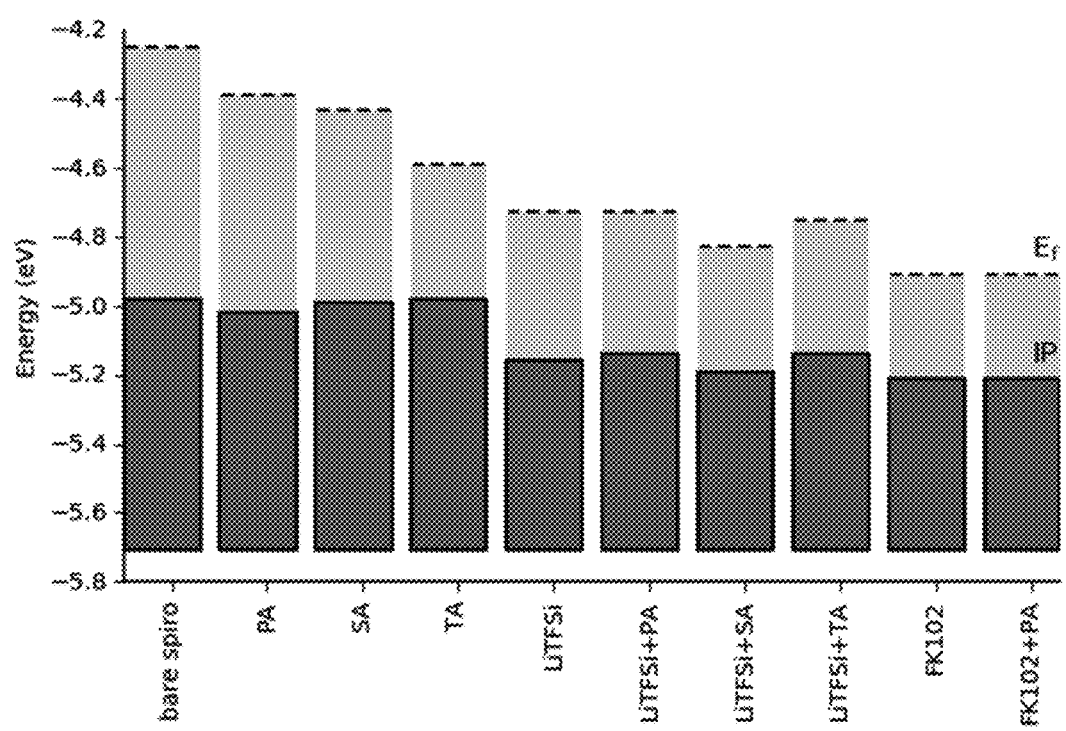
FIG. 23 illustrates the extracted Fermi-level and ionization energies from the UPS spectra illustrated in FIGS. 21 and 22.

The effects of various dopant/acid combinations were investigated using photoelectron spectroscopy to understand their impact on the electronic properties of the spiro-OMeTAD layers. Referring to FIGS. 21 through 23, samples measured using UPS demonstrated a small downshift of the Fermi level ($E_f$) but equivalent ionization energy (IE) from pristine to acid-containing spiro-OMeTAD, which is consistent with what was observed when pure acid was added to the spiro-OMeTAD solution. In contrast, oxidized spiro-OMeTAD, when doped with Li-TFSI or Co(III) salt, showed a more dramatic down shift of $E_f$. This is consistent with extensive p-doping and can explain the increased conductivity. However, no obvious change in $E_f$ or IE can be found when comparing the oxidant-only samples to the samples using both an oxidant and an acid. This result suggests that the acid was not introducing more charge-carriers when the oxidation of the spiro-OMeTAD reached a saturation state and the further increase in conductivity is likely due to other effects, such as the inductive nature of hydrogen-bonding.

Figure 24:
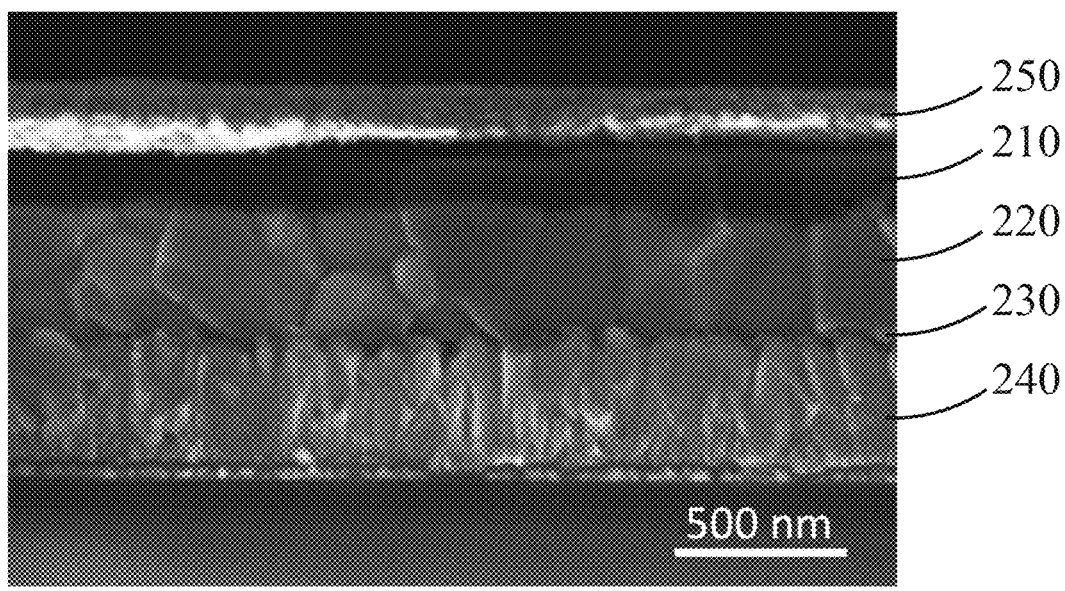
FIG. 24 illustrates and SEM cross sectional image of the $FA_{0.85}Cs_{0.15}PbI_3$ perovskite solar cell, according to some embodiments of the present disclosure.
Figure 25:
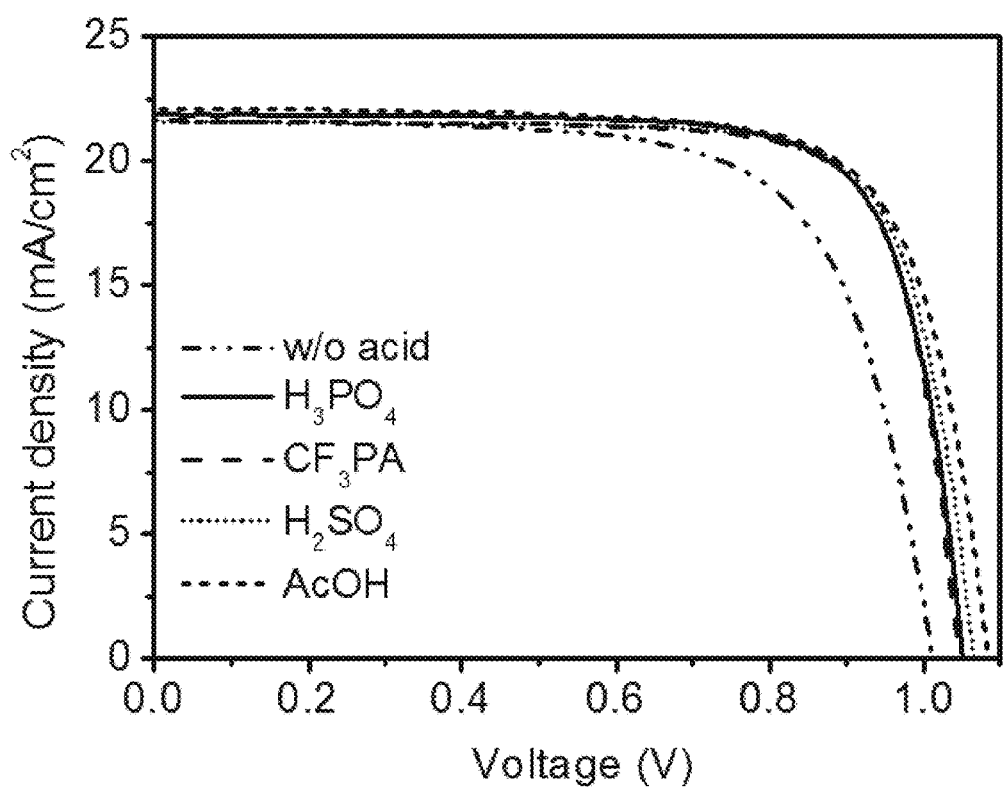
FIG. 25 illustrates PSC performance with and without acid additions, according to some embodiments of the present disclosure (spiro-OMeTAD is pre-doped with Li-TFSI and FK102 to achieve a better baseline performance): Light J-V curves of solar cells with different acids.

In addition, the effectiveness of adding a variety of moderate-to-strong acids ($H_3PO_4$, $CF_3PA$, $H_2SO_4$, AcOH) to spiro-OMeTAD HTL formulations in formamidinium (FA) cesium lead iodine-based ($FA_{0.85}Cs_{0.15}PbI_3$) PSCs was examined. For the reference (e.g. without acid) and acid-containing devices, both Li-TFSI and FK209 were used as dopants in the spiro-OMeTAD HTL formulation. FIG. 24 shows a cross-section SEM image of a PSC with the following structure: glass/FTO/compact (first charge collecting layer 240) $TiO_2$ (ETL 230)/$FA_{0.85}Cs_{0.15}PbI_3$ (perovskite layer 220)/spiro-OMeTAD (HTL 210)/Ag (second charge collecting layer 250). Light J-V curves of solar devices with and without acid treatment are compared in FIG. 25. The detailed photovoltaic (PV) parameters of these J-V curves are listed in Table 1 below.

TABLE 1

Photovoltaic performance parameters of PSCs with and without acid-treated HTLs.

| Acids | $J_{SC}$ (mA/cm$^2$) | $V_{OC}$ (V) | FF | PCE (%) |
|---|---|---|---|---|
| w/o acid | 21.61 | 1.02 | 0.69 | 15.2 |
| $H_3PO_4$ | 21.88 | 1.06 | 0.76 | 17.6 |
| $CF_3PA$ | 21.59 | 1.04 | 0.78 | 17.5 |
| $H_2SO_4$ | 21.55 | 1.06 | 0.78 | 17.7 |
| AcOH | 22.10 | 1.08 | 0.75 | 17.8 |

All devices using acid-containing HTLs exhibited improved device performance with the improvement resulting at least partially from increased $V_{OC}$ and FF. Interestingly, the improvements were almost identical regardless of the acid used in the HTL formulation. It is important to highlight that the acidity of these acids covers a wide range with $pK_a$ values between about −3 ($H_2SO_4$) and about 4.75 (AcOH), and these acids also have very different counter-anions ($HSO_4^-$, $H_2PO_4^-$, $CF_3PA^-$, $AcO^-$). Thus, the general performance improvements due to acid addition to HTLs appears to be independent of the specific acidity and type of acids, which strongly suggests that acid treating HTLs using moderate-to-strong acids may provide a general strategy for improving charge conduction in HTLs and consequently for enhancing the performance of PSCs using such HTLs. The consistent and significant improvement of $V_{OC}$ using acid-treated HTLs also suggests that acid treating may affect the interface between the HTL and the perovskite layer, helping to reduce the overall recombination losses.

Figure 26:
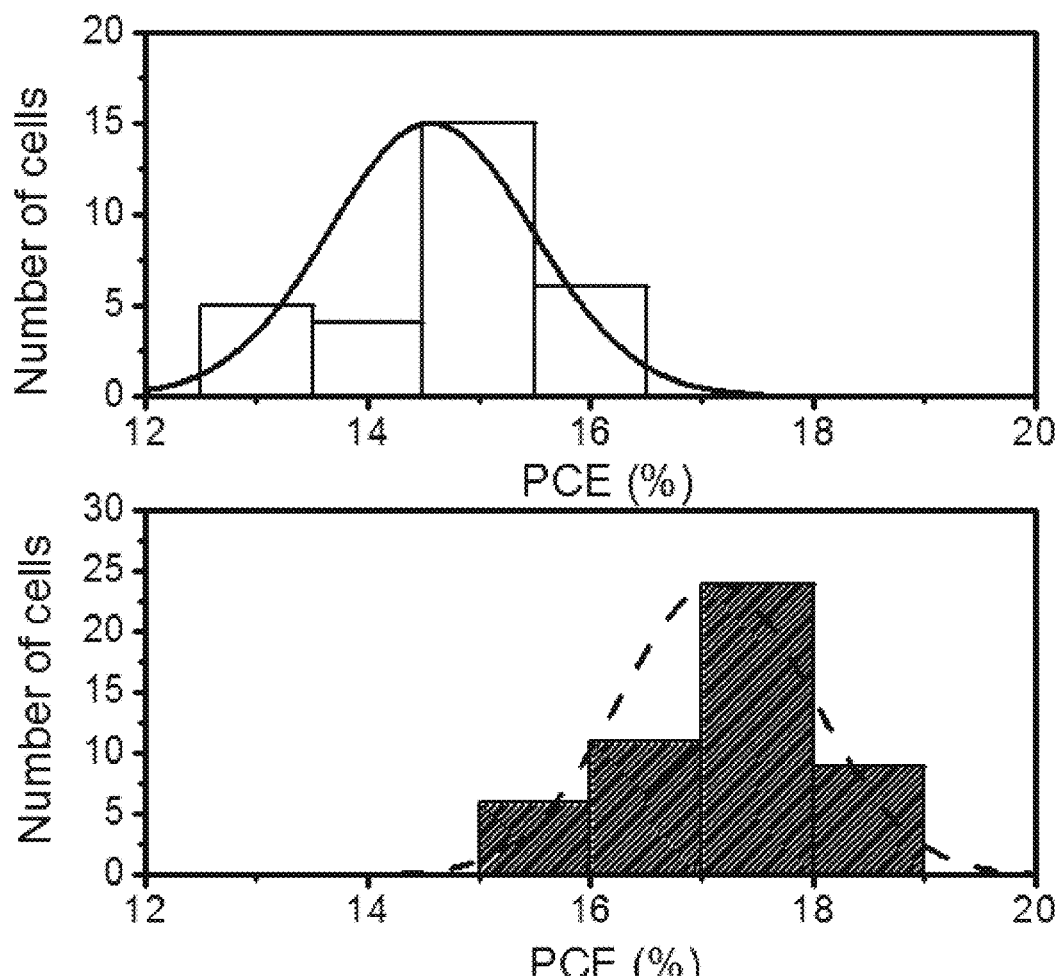
FIG. 26 illustrates PSC performance with and without acid addition, according to some embodiments of the present disclosure (spiro-OMeTAD is pre-doped with Li-TFSI and FK102 to achieve a better baseline performance): Statistical PCE distribution of solar cells with acid (bottom bar graph) and without acid (top bar graph).
Figure 27:
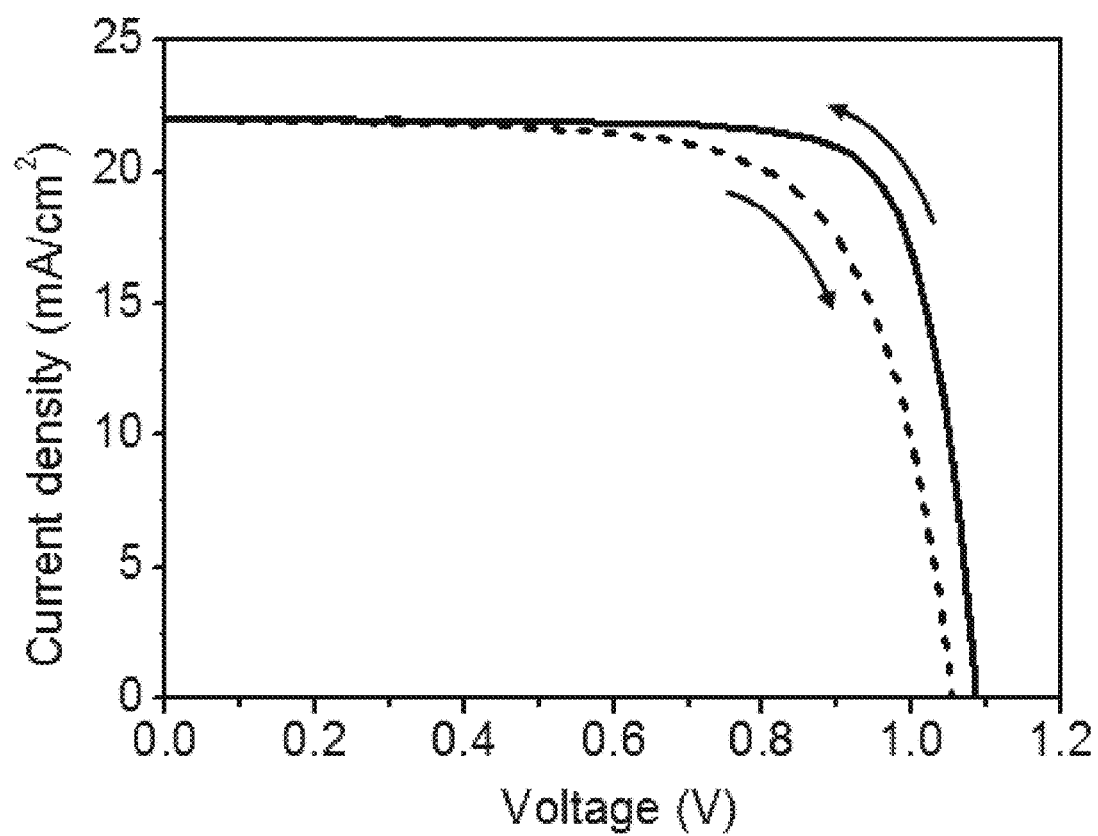
FIGS. 27 and 28 illustrate the stable power output of perovskite solar cell having acid-treated HTL, according to some embodiments of the present disclosure.
Figure 28:
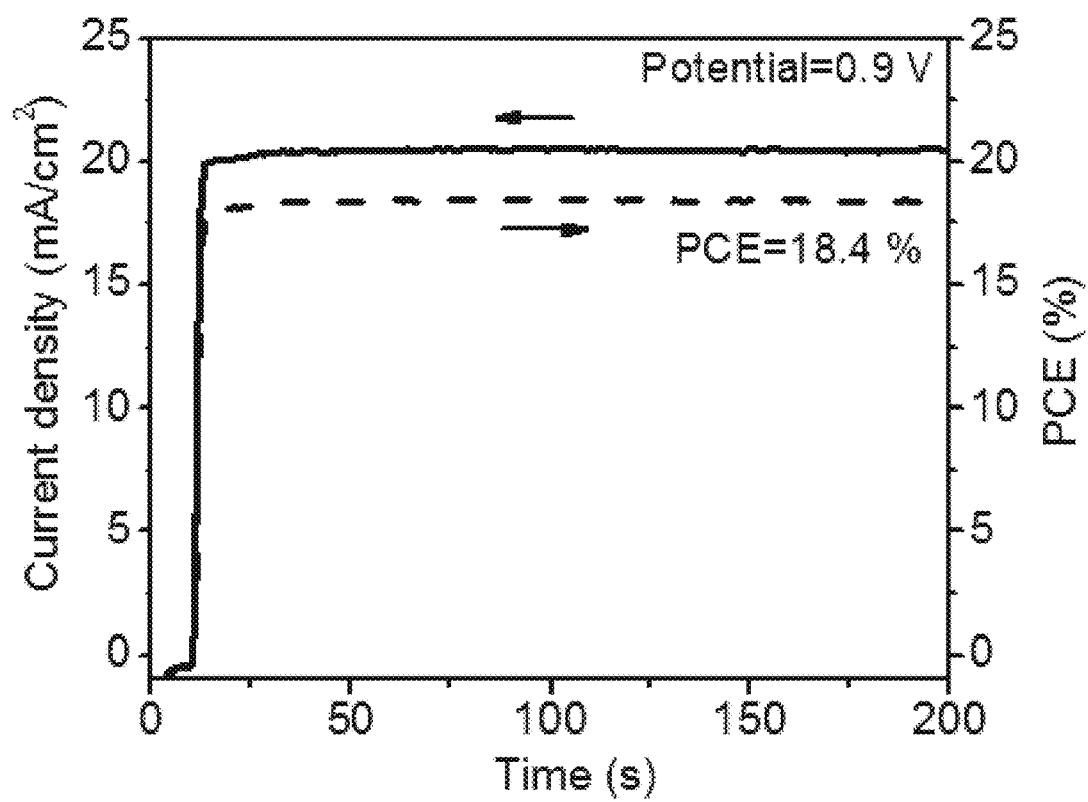
Figure 29:
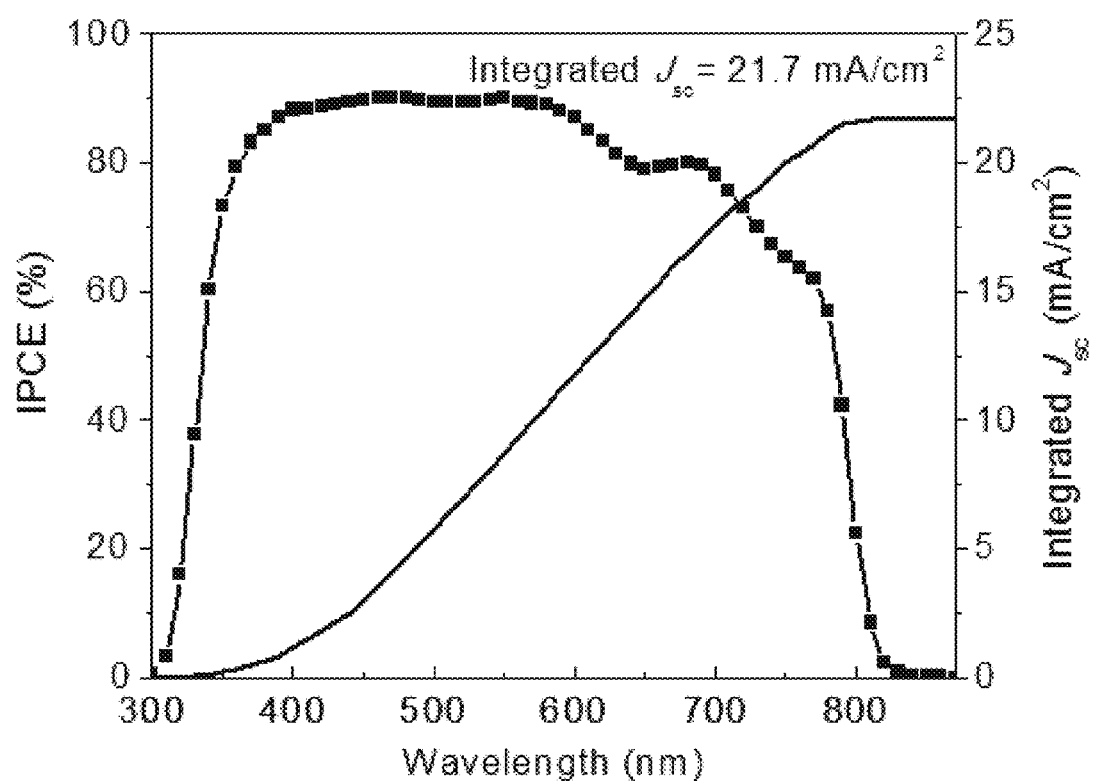
FIG. 29 illustrates the IPCE spectrum and integrated current density perovskite solar device having an acid-containing HTL, according to some embodiments of the present disclosure.

FIG. 26 compares a statistical PCE analysis of devices with histograms of 30 non-acid-treated PSCs and 50 acid-treated devices (top bar graph—without acid; bottom bar graph—with acid). PSCs having acid-containing HTLs exhibited an average PCE of 17.1%, representing an increase of 18% over the 14.5% average PCE of the devices without acid additives. The PSCs using acid-containing HTLs demonstrated the best PCE of 19.0%, with a $V_{OC}$ of 1.06 V, a $J_{SC}$ of 22.03 mA/cm², a FF of 0.82 on the reverse scan, and with the stable output reaching 18.4%, as shown in FIGS. 27 and 28. The corresponding incident photon to current efficiency (IPCE) spectrum and integrated current density of the device are shown in FIG. 29. The IPCE result matches well with the $J_{SC}$ from the J-V measurement and the results are summarized in Table 2 below.

TABLE 2

Stable power output of perovskite solar device having an acid-containing HTL.

| | $J_{SC}$ (mA/cm²) | $V_{OC}$ (V) | FF | Efficiency (%) |
|---|---|---|---|---|
| Reverse | 22.03 | 1.06 | 0.82 | 19.0 |
| Forward | 22.03 | 1.06 | 0.70 | 16.3 |

Figure 30:
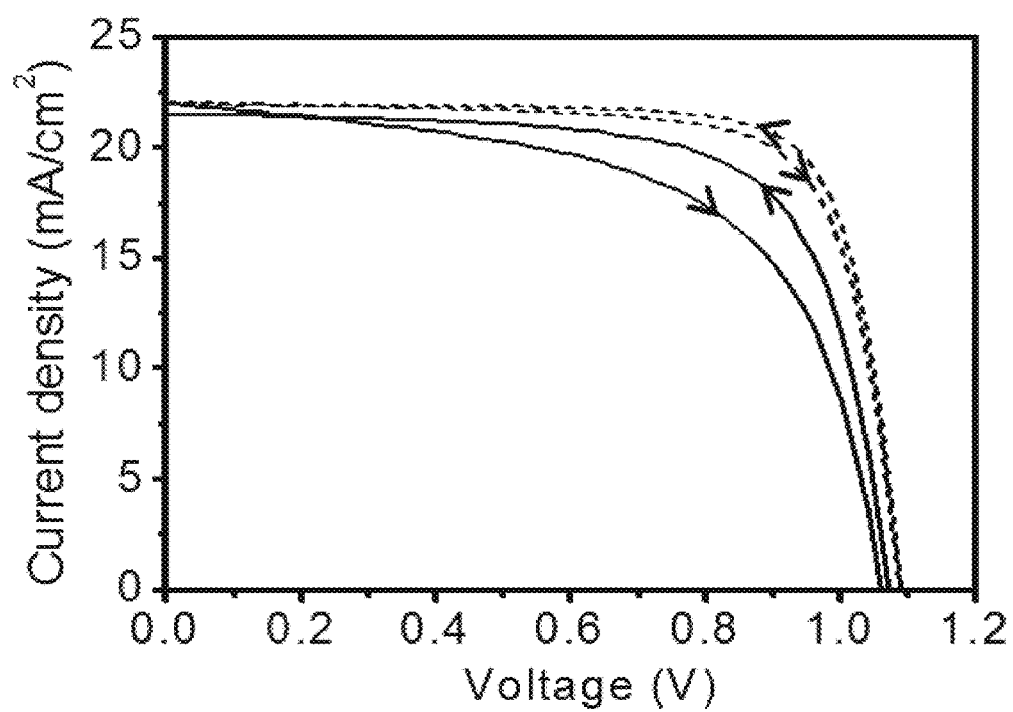
FIG. 30 illustrates PSC performance with and without acid addition, according to some embodiments of the present disclosure: J-V hysteresis of solar cells with forward and reverse scan (dashed lines—with acid; solid lines—without acid).
Figure 31:
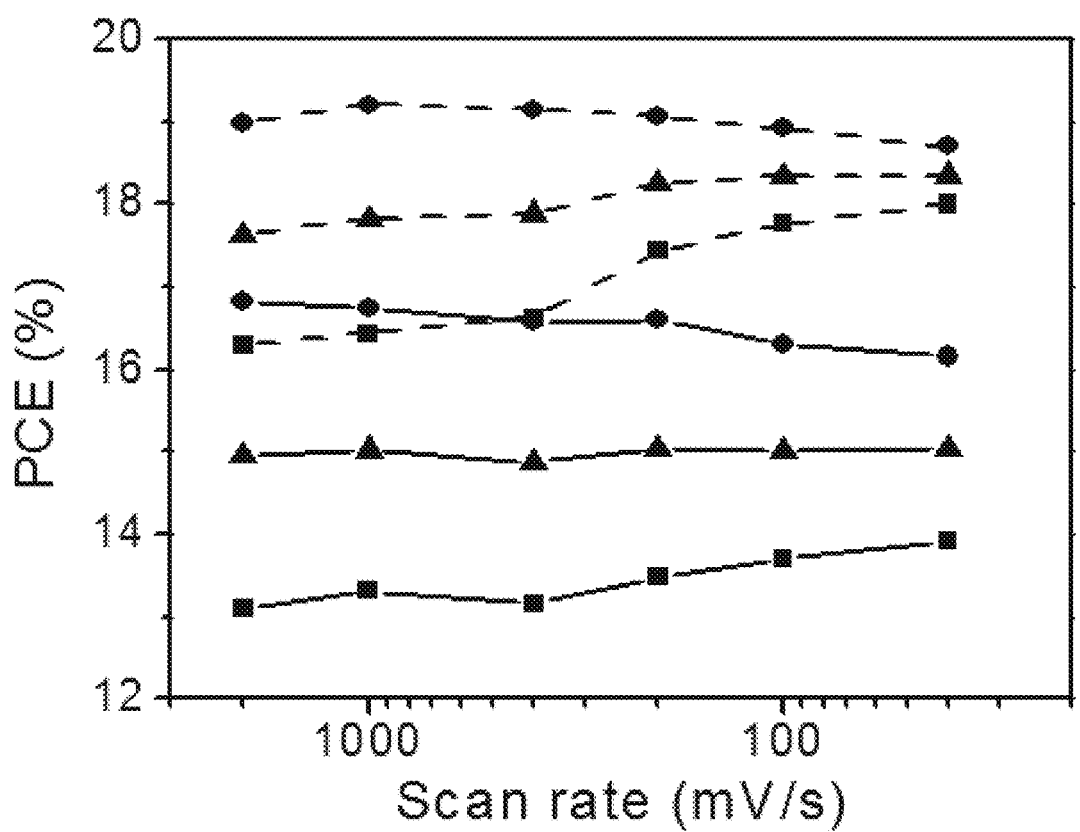
FIG. 31 illustrates PSC performance with and without acid addition, according to some embodiments of the present disclosure: scan rate and scan direction dependent PCE of solar cells (solid lines—without acid; dashed lines—with acid; circles—reverse, triangles—average; squares—forward).
Figure 32:
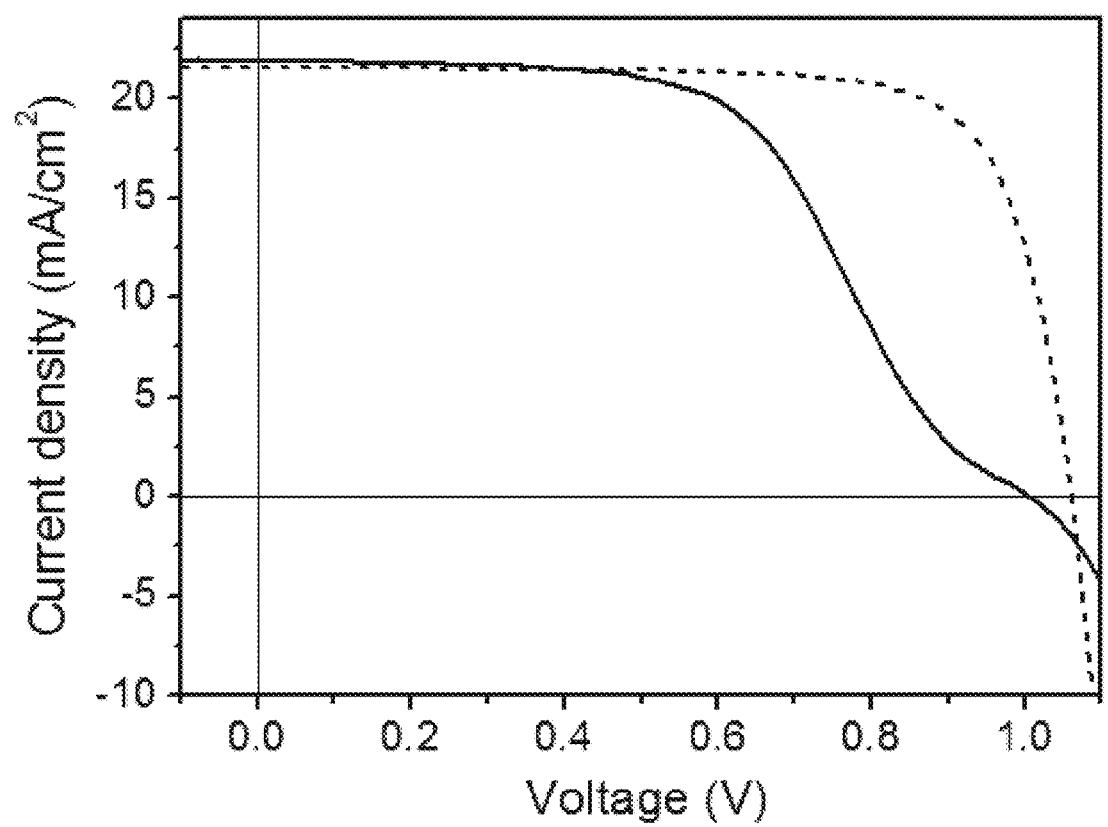
FIG. 32 illustrates light J-V curves of perovskite solar devices using spiro-OMeTAD with Li-TFSI with acid and without acid, according to some embodiments of the present disclosure. (Measurements were done same day as cell fabrication.)
Figure 33:
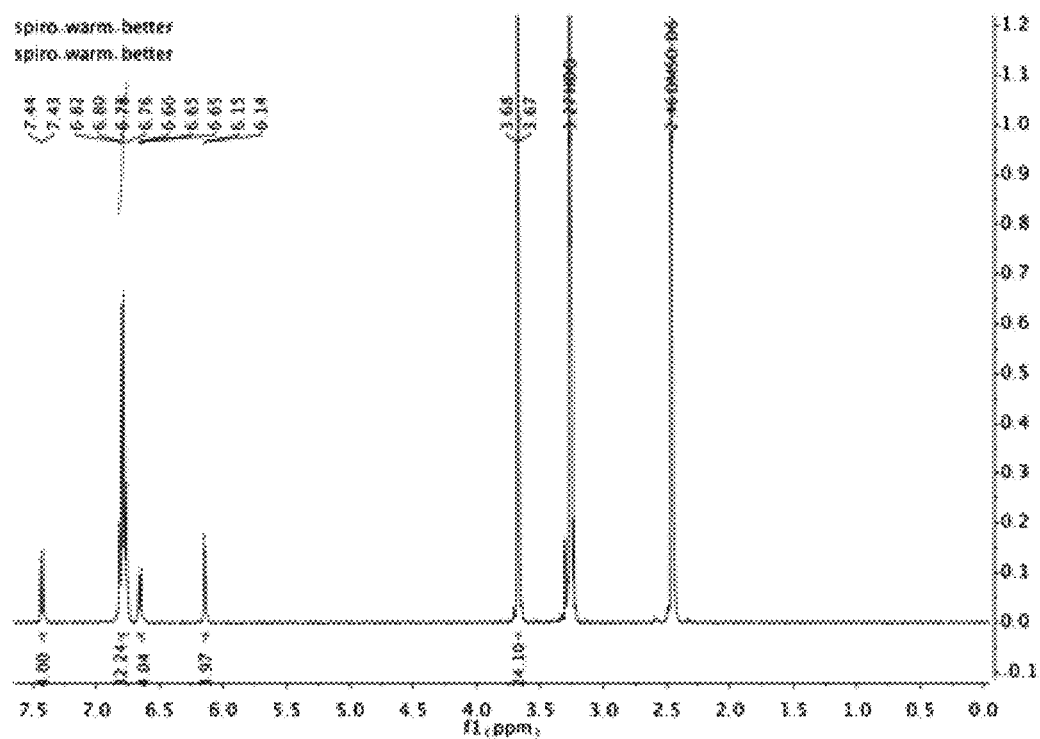
FIGS. 33 and 34 illustrate the full $^1$H NMR spectra of spiro-OMeTAD HTLs (FIG. 33), and CF$_3$PA (FIG. 34), according to some embodiments of the present disclosure.
Figure 34:
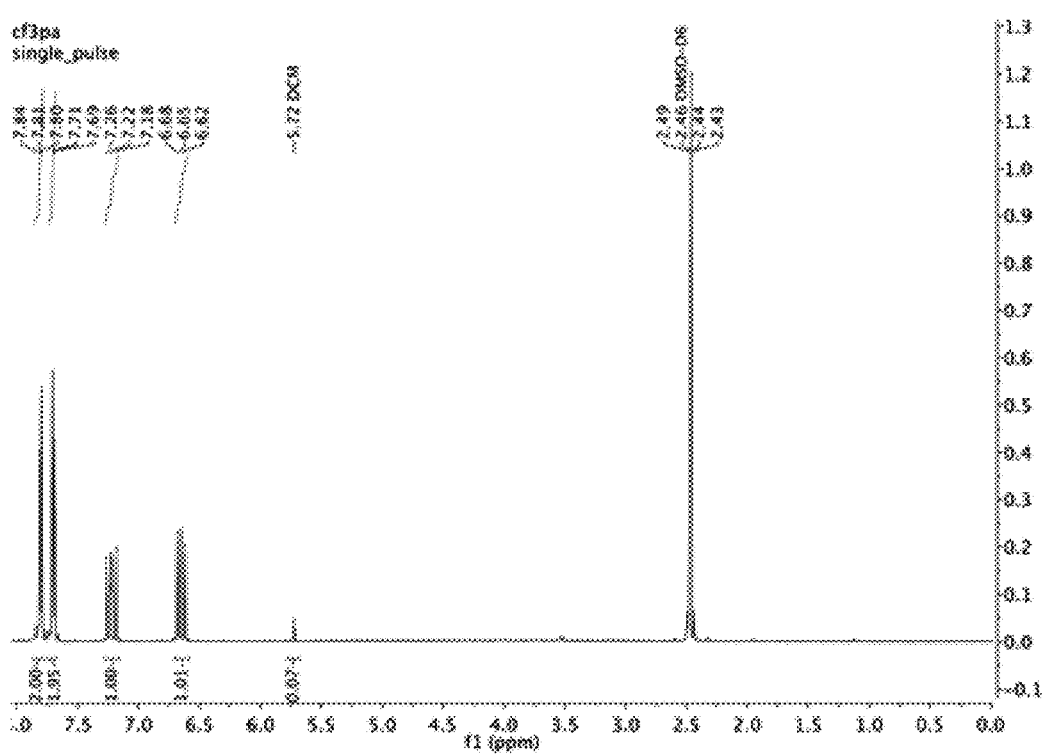
Figure 35:
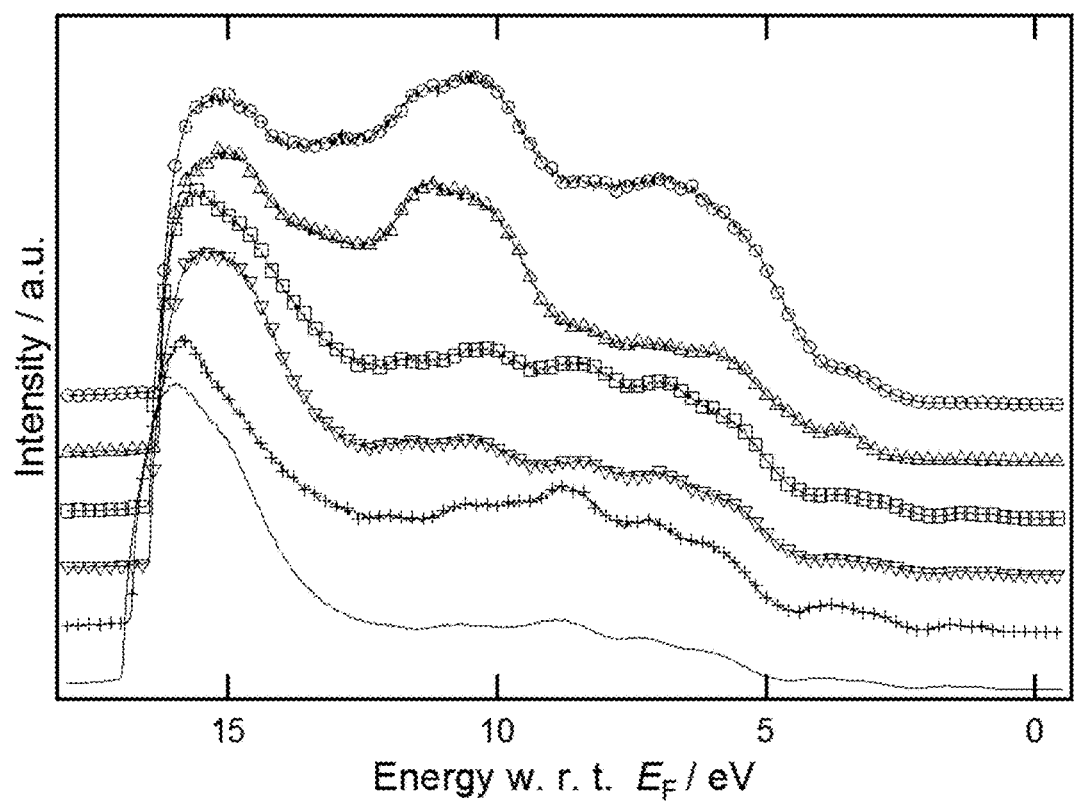
FIG. 35 illustrates the full UPS spectra of spiro-OMeTAD HTLs containing different dopants and/or acids (starting at the top: Co(III)+H$_3$PO$_4$, Co(III), Li-TFSI+H$_3$PO$_4$, Li-TFSI, H$_3$PO$_4$, and pristine).

In addition to the improved device efficiency, it was also determined that the use of acid in an HTL, e.g. spiro-OMeTAD, may significantly reduce the J-V hysteresis in PSCs utilizing the acid-containing spiro-OMeTAD HTL. A large J-V hysteresis is a common phenomenon in PSCs when scanning from different directions, especially for devices with planar structures and using compact TiO₂ as electron-transport layer. However, the origins of hysteresis in PSCs are not well understood. However, one contributing factor to hysteresis may be inefficient charge extraction from the HTL layer. J-V hysteresis of PSCs were evaluated at different scan rates. FIG. 30 shows the typical J-V hysteresis of PSCs with and without an acid-containing HTL, measured with a scan rate of 40 mV/s. FIG. 31 shows the scan-rate dependence of PCEs calculated from the reverse and forward scans as well as the average of these two. It is clear that the hysteresis was smaller for the PSCs that used acid-containing spiro-OMeTAD HTLs, for all scan rates. At the smallest scan rate (40 mV/s), the acid resulted in an almost hysteresis-free PSC performance, whereas PSC utilizing acid-free HTLs exhibited significant hysteresis. Hysteresis was quantified using the following equation:

$$Hysteresis\,factor = \frac{PCE_{reversed} - PCE_{forward}}{PCE_{reverse}}$$

The hysteresis factor for solar devices using acid-containing HTLs at 40 mV/s is only 0.04, compared to 0.14 for solar devices using HTLs without acid. Although the acid-containing devices were not strictly hysteresis-free, hysteresis was significantly reduced compared to the solar devices using acid-free HTLs. Results are summarized in Table 3 below.

TABLE 3

Hysteresis factors of PSCs with and without using acid additives in spiro-OMeTAD HTL under different scanning rates.

| | Scan rate (mV/s) | | | | | |
|---|---|---|---|---|---|---|
| | 2000 | 1000 | 400 | 200 | 100 | 40 |
| w/o acid | 0.22 | 0.21 | 0.21 | 0.19 | 0.16 | 0.14 |
| with acid | 0.14 | 0.14 | 0.13 | 0.09 | 0.06 | 0.04 |

Thus, the use of acids in HTL formulations (e.g. spiro-OMeTAD) are shown to have a positive improvement to the overall performance of PSCs, for example, through increased $V_{OC}$ and FF. Acid effectively improves the conductivity of spiro-OMeTAD doped by Li-TFSI and/or Co (III) salts, but acid alone appears to be insufficient to improve spiro-OMeTAD conductivity for these particular dopants. It is hypothesized that the acid plays two roles for enhancing the conductivity of spiro-OMeTAD. First, in the presence of an alkali metal salt, acid catalyzes the oxidation of spiro-OMeTAD, as evinced by the UV-Vis and conductivity measurements. Second, NMR and UPS show evidence of hydrogen-bonding interactions between the acid and spiro-OMeTAD, which potentially creates a hydrogen-bonding network that decreases the columbic trapping and recombination in doped spiro-OMeTAD by buffering charge-carriers moving through the solid. The use of acid in spiro-OMeTAD HTLs is shown to increase the PSC performance regardless of the $pK_a$ value (over a range of −3 to 4.75) or the identity of the acid used. J-V hysteresis is also significantly reduced through the use of acid in the HTL formulation. Thus, using acid is promising as a general approach to enhance the conductivity of spiro-OMeTAD for developing high-efficiency hysteresis-free TiO₂ based planar PSCs.

Experimental:

Spiro-OMeTAD Treating.

Spiro-OMeTAD (>99%) was purchased from Lumitech and used without further purification. Spiro-OMeTAD (80 mg) was dissolved in chlorobenzene (1 mL) containing 4-tert-butylpyridine (tBP) (32 µL). For Li-TFSI or Na-TFSI doping, 50 mol % of dopant with respect to spiro-OMeTAD was added via a 1.8 M Li-TFSI or Na-TFSI acetonitrile solution. For cobalt doping, 15 mol % of Co (III) with respect to spiro-OMeTAD was added. For acid-containing formulations, 10 mol % acid to spiro-OMeTAD was added (through 200 mM ethanol solution). The spiro-OMeTAD solution was shaken thoroughly and filtered through 0.2 micron syringe filters before spin coating or other characterizations.

Solar Device Fabrication.

A patterned fluorine-doped tin oxide (FTO) (e.g. current collecting layer) was deposited with 50 nm compact TiO₂ layer (ETL) by spray pyrolysis at 450° C. A $FA_{0.85}Cs_{0.15}PbI_3$ perovskite precursor solution was prepared by dissolving 146.2 mg $CH_3(NH_2)_2I$ (FAI, Dyesol), 39.0 mg CsI (99.999%, Sigma-Aldrich) and 461.0 mg PbI₂ (99.9985%, Alfa Aesar) in 1 mL of dimethyl sulfoxide (DMSO) and dimethylformamide (DMF) (v/v=3/7) mixed solvent. Perovskite layers were deposited in a dry air box using a three-step spin-coating procedure with the first step of 100 rpm for 3 seconds, second step of 3500 rpm for 10 seconds, and the last step of 5000 rpm for 30 seconds. 1 mL of toluene was applied on the spinning substrates at 20 seconds of the third step. After spin coating, the layers and devices were annealed at 170° C. for 20 min. Spiro-OMeTAD (HTL) was spin-coated on the perovskite layer at 4000 rpm for 35 seconds. Finally, a 150-nm Ag current collecting layer was deposited by thermal evaporation. A typical solar device had a 350 nm $FA_{0.85}Cs_{0.15}PbI_3$ perovskite layer positioned between a 50 nm TiO₂ layer (ETL) and a 200 nm spiro-OMeTAD HTL.

Solar Device Characterization.

Solar device performance was measured under a simulated AM 1.5G illumination (100 mW/cm², Oriel Sol3A Class AAA Solar Simulator). The dark and light J-V characteristics were measured using a Keithley 2400 source meter with voltage step width of 20 mV, scan rate was controlled by changing the delay time between each step.

The continuous current and power output were measured using a potentiostat (Princeton Applied Research, VersaSTAT MC). Incident photon to current efficiency (IPCE) spectra of solar devices were measured using a solar device quantum-efficiency measurement system (QEX10, PV Measurements). Cross section morphology of the solar device is characterized using a field emission scanning electron microscope (Nova 630, FEI).

Spiro-OMeTAD Characterizations.

Conductivity of spiro-OMeTAD HTLs were measured using four wire configurations with four parallel Ag electrodes. The spacing between each current collecting layer was 2 mm. Thickness of the spiro-OMeTAD HTLs were measured using a profilometer. The typical thickness of a spin coating spiro-OMeTAD HTL was about 300 nm. UV-Vis spectra of spiro-OMeTAD were measured using a UV/Vis spectrophotometer (Cary-6000i) in both HTLs and solution forms of the hole-transport material. For thin layer UV-Vis, spiro-OMeTAD HTLs were spin coated on glass substrates from chlorobenzene solution. The solid HTLs were kept in a dry air box for oxidation aging. Solutions were also concentrated by rotary evaporation, then redissolved in THF and re-measured. Photoemission Spectroscopy measurements were performed on a Kratos NOVA spectrometer calibrated to the Fermi edge and core level positions of sputter-cleaned metal (Au, Ag, Cu, Mo) surfaces. Ultraviolet photoemission spectra were acquired from the He I (21.22 eV) excitation line at a nominal experimental resolution below 150 meV. X-ray photoemission spectra were taken using monochromated Al K alpha radiation (1486.7 eV) at a resolution of 400 meV. The acquired spectra were all referenced to the previously determined Fermi level of the sputter-cleaned metal calibration samples.

$^1$H NMR, and UV-Vis Spectroscopy.

Samples for NMR were prepared by dissolving spiro-OMeTAD in THF (30 mg in 10 mL or 2.45 mM). $CF_3PA$, pTSA, or FK209 were dissolved in THF and diluted to the same concentration as the spiro-OMeTAD solution. Solutions were mixed in ambient environment with 1 mL of spiro-OMeTAD, and 0.25, 0.5, 0.75, 1.0, 2.0, or 4.0 mL of $CF_3PA$, pTSA, or FK209 to achieve 0.25-4 equivalents. Solutions were then rotovapped down to a solid and redissolved in DMSO-d6 for measurements. NMR spectra were obtained on a JEOL ECA 500 liquid-state NMR spectrometer. For solution UV-Vis, samples were prepared using the same method for NMR samples, but using chlorobenzene as a solvent for spiro-OMeTAD, and acetonitrile for the $CF_3PA$, pTSA, or FK209. Spectra of layers were taken by dropcasting layers onto microscope coverslips. Solid samples were prepared by rotary evaporation of the vials, followed by redissolution in an equal volume of chlorobenzene. Spectra were obtained using a Beckman-Coulter D600 UV-Vis spectrometer.

EXAMPLES

Example 1

A device comprising: a first layer comprising a hole-transport material and an acid, wherein: the first layer has a conductivity between 20 µS/cm and 500 µS/cm.

Example 2

The device of example 1, wherein the first layer absorbs light having a wavelength between 400 nm and 600 nm.

Example 3

The device of example 1, wherein the hole-transport material comprises at least one of 2,2',7,7'-tetrakis(N,N-di-p-methoxyphenylamine)-9,9'-spirobifluorene (spiro-OMeTAD), a derivative of spiro-OMeTAD, poly(triarylamine), poly(3-hexylthiophene), or N,N'-bis(3-methylphenyl)-N,N'-diphenylbenzidine.

Example 4

The device of example 3, wherein the derivative of spiro-OMeTAD comprises at least one of pp-spiro-OMeTAD, pm-spiro-OMeTAD, or po-spiro-OMeTAD.

Example 5

The device of example 1, wherein the acid comprises at least one of an organic acid or an inorganic acid.

Example 6

The device of example 5, wherein the organic acid comprises at least one of acetic acid, citric acid, formic acid, lactic acid, oxalic acid, cinnamic acid, a sulfonic acid, a phosphonic acid, or a carboxylic acid.

Example 7

The device of example 5, wherein the inorganic acid comprises at least one of HCl, HBr, HI, $HNO_3$, $H_3PO_4$, $H_3PO_3$, $H_2SO_4$, or $H_2SeO_4$.

Example 8

The device of example 1, wherein the first layer further comprises a dopant comprising at least one of an alkaline salt, a Co(III) salt, 2,3,5,6-tetrafluoro-7,7,8,8-tetracyanoquinodimethane, $SnCl_4$, Ag—N-butyl-N'-(4-pyridylheptyl)imidazolium bis(trifluoromethane)sulfonamide (Ag-TFSI), N-butyl-N'-(4-pyridylheptyl)imidazolium bis(trifluoromethane)sulfonimide, or $N(PhBr)_3SbCl_6$.

Example 9

The device of example 8, wherein the conductivity is between 100 µS/cm and 500 µS/cm.

Example 10

The device of example 8, wherein the alkaline salt comprises at least one of Li-TFSI, Na-TFSI, K-TFSI, $LiSO_3F$, $NaSO_3F$, $KSO_3F$, $LiSbF_6$, $NaSbF_6$, $KSbF_6$, $LiPF_6$, $NaPF_6$, or $KPF_6$.

Example 11

The device of example 8, wherein the Co(III) salt comprises at least one of (tris(2-(1H-pyrazol-1-yl)-4-tert-butylpyridine)cobalt(III) tri[bis(trifluoromethane)sulfonimide]), (tris(2-(1H-pyrazol-1-yl)pyridine)cobalt(III) tri[bis(trifluoromethane)sulfonimide], (bis(2,6-di(1H-pyrazol-1-yl)pyridine)cobalt(III) tri[bis(trifluoromethane)sulfonimide]), or tris(2-(1H-pyrazol-1-yl)pyrimidine)cobalt(III) tri[bis(trifluoromethane)sulfonimide].

Example 12

The device of example 1, further comprising: a perovskite layer; and an electron-transport layer, wherein: the perovskite layer is positioned between the first layer and the electron-transport layer, and the device has a fill-factor of greater than 0.70 and a power conversion efficiency of greater than 17%.

Example 13

The device of example 12, wherein the perovskite layer comprises $ABX_3$, A is a first cation, B is a second cation, and X is an anion.

Example 14

The device of example 13, wherein the first cation comprises an alkyl ammonium cation or an alkali metal cation.

Example 15

The device of example 14, wherein the alkali metal cation comprises at least one of cesium or rubidium.

Example 16

The device of example 14, wherein the alkyl ammonium cation comprises at least one of methylammonium, ethylammonium, propylammonium, butylammonium, or formamidinium (FA).

Example 17

The device of example 13, wherein the second cation comprises a metal in the 2+ valence state.

Example 18

The device of example 13, wherein second cation comprises at least one of lead, tin, or germanium.

Example 19

The device of example 13, wherein the anion comprises a halogen.

Example 20

The device of example 12, wherein: the perovskite layer comprises at least one of $CH_3NH_3PbI_3$, $CH_3NH_3PbBr_3$, $CH_3NH_3PbCl_3$, $CH_3NH_3PbI_{3-x}Cl_x$, or $CH_3NH_3PbI_{3-x}Br_x$, and x is between zero and 3.0 inclusively.

Example 21

The device of example 12, wherein: the perovskite layer comprises $FA_{1-x}Cs_xPbI_3$, and x is between zero and 1.0 inclusively.

Example 22

The device of example 21, wherein the perovskite layer comprises $FA_{0.85}Cs_{0.15}PbI_3$.

Example 23

The device of example 12, wherein the electron-transport layer comprises at least one $TiO_2$, $SnO_2$, ZnO, $BaSO_4$, [6,6]-phenyl-$C_{61}$-butyric acid methyl ester, or buckminsterfullerene.

Example 24

The device of example 12, further comprising: a first charge collecting layer; and a second charge collecting layer, wherein: the layer is positioned between the first charge collecting layer and the perovskite layer, and the electron-transport layer is positioned between the second charge collecting layer and the perovskite layer.

Example 25

The device of example 24, wherein the first charge collecting layer comprises at least one of silver, gold, copper, or aluminum.

Example 26

The device of example 24, wherein the second charge collecting layer comprises at least one of fluorine-doped tin oxide, indium tin oxide, indium zinc oxide, or $Cd_2SnO_4$.

Example 27

A method comprising: mixing a hole-transport material, a dopant, an acid, and a solvent to form a solution; separating the solution into a liquid and a solid; applying the liquid to a surface of a perovskite layer to form a liquid layer on the surface; and removing at least a portion of the solvent to transform the liquid layer to a solid layer comprising the hole-transport material, the dopant, and the acid, wherein: the liquid is substantially free of the solid, the solid is substantially free of the liquid, and the solid layer has a conductivity between 100 µS/cm and 500 µS/cm.

Example 28

The method of example 27, wherein the solid layer absorbs light having a wavelength between 400 nm and 600 nm.

Example 29

The method of example 27, wherein the solvent comprises at least one of a polar solvent or a non-polar solvent.

Example 30

The method of example 29, wherein the polar solvent comprises at least one of chlorobenzene, acetonitrile, or an alcohol.

Example 31

The method of example 27, wherein the mixing further comprises 4-tert-butylpyridine (tBP).

Example 32

The method of example 27, wherein the dopant comprises at least one of an alkaline salt, a Co(III) salt, 2,3,5,6-tetrafluoro-7,7,8,8-tetracyanoquinodimethane, $SnCl_4$, Ag-TFSI, N-butyl-N'-(4-pyridylheptyl)imidazolium bis(trifluoromethane)sulfonimide, or $N(PhBr)_3SbCl_6$.

Example 33

The method of example 32, wherein the alkaline superacid salt comprises at least one of Li-TFSI, Na-TFSI, K-TFSI, $LiSO_3F$, $NaSO_3F$, $KSO_3F$, $LiSbF_6$, $NaSbF_6$, $KSbF_6$, $LiPF_6$, $NaPF_6$, or $KPF_6$.

Example 34

The method of example 32, wherein the Co(III) salt comprises at least one of tris(2-(1H-pyrazol-1-yl)-4-tert-butylpyridine)cobalt(III) tri[bis(trifluoromethane)sulfonimide], tris(2-(1H-pyrazol-1-yl)pyridine)cobalt(III) tri[bis(trifluoromethane)sulfonimide, or (bis(2,6-di(1H-pyrazol-1-yl)pyridine)cobalt(III) tri[bis(trifluoromethane)sulfonimide], or tris(2-(1H-pyrazol-1-yl)pyrimidine)cobalt(III) tri[bis(trifluoromethane)sulfonimide].

Example 35

The method of example 32, wherein the dopant is present at a first concentration between 1 mol % and 75 mol % relative to the hole-transport material.

Example 36

The method of example 27, wherein the acid comprises at least one of an organic acid or an inorganic acid.

Example 37

The method of example 36, wherein the organic acid comprises at least one of acetic acid, citric acid, formic acid, lactic acid, oxalic acid, a sulfonic acid, a phosphonic acid, or a carboxylic acid.

Example 38

The method of example 36, wherein the inorganic acid comprises at least one of HCl, HBr, HI, $HNO_3$, $H_3PO_4$, $H_3PO_3$, $H_2SO_4$, or $H_2SeO_4$.

Example 39

The method of example 36, wherein the acid is present in the solution at a second concentration between 1 mol % and 50 mol % with respect to the hole-transport material.

Example 40

The method of example 36, wherein the acid has a $pk_a$ value between −10 and 5.

Example 41

The method of example 27, wherein the separating is performed by at least one of filtrating, centrifugation, or electrostatic separation.

Example 42

The method of example 41, wherein the separating is by filtrating using a filter having an average pore size of less than 1.0 microns.

Example 43

The method of example 27, wherein the applying is performed using at least one of spin-coating, curtain-coating, dip-coating, blade-coating, slot-die coating, or spraying.

Example 44

The method of example 27, wherein the mixing is performed at a temperature between 15° C. and 100° C.

Example 45

The method of example 27, wherein the removing is performed by at least one of centrifugation, heating the liquid layer, or flowing a gas over the liquid layer.

Example 46

The method of example 45, wherein the removing comprises heating the liquid layer to a temperature between 30° C. and 100° C.

Example 47

The method of example 45, wherein the gas comprises an inert gas.

Example 48

The method of example 47, wherein the inert gas comprises at least one of nitrogen or argon.

Example 49

The method of example 22, wherein: the perovskite layer comprises $ABX_3$, A is a first cation, B is a second cation, and X is an anion.

Example 50

The method of example 49, wherein the first cation comprises an alkyl ammonium cation or an alkali metal cation.

Example 51

The method of example 50, wherein the alkali metal cation comprises at least one of cesium or rubidium.

Example 52

The method of example 50, wherein the alkyl ammonium cation comprises at least one of methylammonium, ethylammonium, propylammonium, butylammonium, or formamidinium (FA).

Example 53

The method of example 49, wherein the second cation comprises a metal in the 2+ valence state.

Example 54

The method of example 49, wherein second cation comprises at least one of lead, tin, or germanium.

Example 55

The method of example 49, wherein the anion comprises a halogen.

Example 56

The method of example 49, wherein: the perovskite layer comprises at least one of $CH_3NH_3PbI_3$, $CH_3NH_3PbBr_3$, $CH_3NH_3PbCl_3$, $CH_3NH_3PbI_{3-x}Cl_x$, or $CH_3NH_3PbI_{3-x}Br_x$, and x is between zero and 3.0 inclusively.

Example 57

The method of example 52, wherein: the perovskite layer comprises at least one of $FA_{1-x}Cs_xPbI_3$, and x is between zero and 1.0 inclusively.

Example 58

The method of example 57, wherein the perovskite layer comprises $FA_{0.85}Cs_{0.15}PbI_3$.

Example 59

A method comprising: mixing a hole-transport material, a dopant, an acid, and a solvent to form a solution; applying the liquid to a surface of a perovskite layer to form a liquid layer on the surface; and removing at least a portion of the solvent to transform the liquid layer to a solid layer comprising the hole-transport material, the dopant, and the acid, wherein: the solid layer has a conductivity between 100 µS/cm and 500 µS/cm.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A photovoltaic device comprising:
   a hole-transport layer comprising 2,2',7,7'-tetrakis(N,N-di-p-methoxyphenylamine)-9,9'-spirobifluorene (spiro-OMeTAD) and an acid; and
   a perovskite layer, wherein:
   the perovskite layer is in physical contact with the first hole-transport layer, and
   the acid is selected from the group consisting of citric acid, formic acid, lactic acid, oxalic acid, cinnamic acid, a sulfonic acid, a phosphonic acid, a carboxylic acid, hydrochloric acid, hydrobromic acid, hydroiodic acid, nitric acid, phosphoric acid, phosphorous acid, sulfuric acid, and selenic acid.

2. The photovoltaic device of claim 1, wherein the hole-transport layer absorbs light having a wavelength between 400 nm and 600 nm.

3. The photovoltaic device of claim 1, wherein the hole-transport layer further comprises at least one of a derivative of spiro-OMeTAD, poly(triarylamine), poly(3-hexylthiophene), or N,N'-bis(3-methylphenyl)-N,N'-diphenylbenzidine.

4. The photovoltaic device of claim 1, wherein the hole-transport layer further comprises a dopant comprising at least one of an alkaline salt, a Co(III) salt, 2,3,5,6-tetrafluoro-7,7,8,8-tetracyanoquinodimethane, $SnCl_4$, Ag—N-butyl-N'-(4-pyridylheptyl)imidazolium bis(trifluoromethane)sulfonamide, N-butyl-N'-(4-pyridylheptyl)imidazolium bis(trifluoromethane)sulfonimide, or $N(PhBr)_3SbCl_6$.

5. The photovoltaic device of claim 1, wherein the hole-transport layer has a conductivity between 20 µS/cm and 500 µS/cm.

6. The photovoltaic device of claim 5, wherein the conductivity is between 100 µS/cm and 500 µS/cm.

7. The photovoltaic device of claim 1, further comprising:
   an electron-transport layer, wherein:
   the perovskite layer is positioned between the first hole-transport layer and the electron-transport layer, and
   the device has a fill-factor of greater than 0.70 and a power conversion efficiency of greater than 17%.

8. The photovoltaic device of claim 7, wherein:
   the perovskite layer comprises $FA_{1-x}Cs_xPbI_3$, and x is between zero and 1.0 inclusively.

9. The photovoltaic device of claim 8, wherein the perovskite layer comprises $FA_{0.85}Cs_{0.15}PbI_3$.

10. The photovoltaic device of claim 1, wherein the perovskite layer comprises $ABX_3$, A is a first cation, B is a second cation, and X is an anion.

11. The photovoltaic device of claim 10, wherein the second cation comprises at least one of lead, tin, or germanium.

12. The photovoltaic device of claim 10, wherein the anion comprises a halogen.

13. The photovoltaic device of claim 10, wherein the first cation comprises an alkyl ammonium cation or an alkali metal cation.

14. The photovoltaic device of claim 13, wherein the alkali metal cation comprises at least one of cesium or rubidium.

15. The photovoltaic device of claim 13, wherein the alkyl ammonium cation comprises at least one of methylammonium, ethylammonium, propylammonium, butylammonium, or formamidinium (FA).

16. A method comprising:
   mixing a hole-transport material comprising 2,2',7,7'-tetrakis(N,N-di-p-methoxyphenylamine)-9,9'-spirobifluorene (spiro-OMeTAD), a dopant, an acid, and a solvent to form a solution,
   separating the solution into a liquid and a solid,
   applying the liquid to a surface of a perovskite layer to form a liquid layer on the surface, and
   removing at least a portion of the solvent to transform the liquid layer to a hole-transport layer comprising the spiro-OMeTAD, the dopant, and the acid, wherein:
   the perovskite layer is in physical contact with the hole-transport layer,
   the acid is selected from the group consisting of citric acid, formic acid, lactic acid, oxalic acid, cinnamic acid, a sulfonic acid, a phosphonic acid, a carboxylic acid, hydrochloric acid, hydrobromic acid, hydroiodic acid, nitric acid, phosphoric acid, phosphorous acid, sulfuric acid, and selenic acid,
   the liquid is substantially free of the solid,
   the solid is substantially free of the liquid, the solid layer has a conductivity between 100 µS/cm and 500 µS/cm, and whereby the photovoltaic device of claim 1 is produced.

17. The method of claim 16, wherein the separating is performed by at least one of filtrating, centrifugation, or electrostatic separation.

18. The method of claim 17, wherein the separating is by filtrating using a filter having an average pore size of less than 1.0 micron.

19. The method of claim 16, wherein the applying is performed using at least one of spin-coating, curtain-coating, dip-coating, blade-coating, slot-die coating, or spraying.

20. The method of claim 16, wherein the mixing is performed at a temperature between 15° C. and 100° C.

21. The method of claim 16, wherein the removing is performed by at least one of centrifugation, heating the liquid layer, or flowing a gas over the liquid layer.

22. The method of claim 21, wherein the removing comprises heating the liquid layer to a temperature between 30° C. and 100° C.

* * * * *